(12) United States Patent
Nakamura et al.

(10) Patent No.: US 7,030,555 B2
(45) Date of Patent: Apr. 18, 2006

(54) ORGANIC ELECTROLUMINESCENCE DEVICE, PLANAR LIGHT SOURCE AND DISPLAY DEVICE USING THE SAME

(75) Inventors: Toshitaka Nakamura, Ibaraki (JP); Noriyuki Juni, Ibaraki (JP); Minoru Miyatake, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 179 days.

(21) Appl. No.: 10/817,003

(22) Filed: Apr. 5, 2004

(65) Prior Publication Data

US 2004/0212296 A1 Oct. 28, 2004

(30) Foreign Application Priority Data

Apr. 4, 2003 (JP) ............................ P2003-101442
Apr. 7, 2003 (JP) ............................ P2003-102458

(51) Int. Cl.
*H01J 1/62* (2006.01)
(52) U.S. Cl. ....................... 313/504; 313/506
(58) Field of Classification Search ............... 313/498, 313/501, 503, 504, 506, 512
See application file for complete search history.

(56) References Cited

FOREIGN PATENT DOCUMENTS

| JP | 63-314795 A | 12/1988 |
| JP | 3-152897 A | 6/1991 |

(Continued)

OTHER PUBLICATIONS

Takuya Ogawa et al, [IEICE Trans Electron] vol. E-85-C, No. 6, pp 1239-1244, Jun. 2002.

(Continued)

*Primary Examiner*—Vip Patel
(74) *Attorney, Agent, or Firm*—Sughrue Mion, PLLC

(57) ABSTRACT

An organic EL cell is formed to satisfy the expression (1): $B_0 < B_\theta$ in which $B_0$ is a normal luminance intensity of luminescence radiated from a light extraction surface to an observer side, and $B_\theta$ is a luminance intensity of the luminescence at an angle of 50° to 70°. A region for disturbing an angle of reflection/refraction of light is provided in an optical path in which the luminescence is output from said emitting layer to the observer side through said transparent electrode. As the region, an anisotropic scattering resin layer containing a light-transmissive resin, and micro domains dispersed/distributed in the light-transmissive resin and different in birefringence characteristic may be formed substantially without interposition of any air layer in an optical path in which the luminescence is output from the emitting layer to the observer side through the transparent electrode. At least one kind of luminescent material is contained in the anisotropic scattering resin layer or between the anisotropic scattering resin layer and the emitting layer so that the luminescent material generates fluorescence or phosphorescence when the luminescent material absorbs the luminescence radiated from the emitting layer as an excitation light source.

14 Claims, 5 Drawing Sheets

FOREIGN PATENT DOCUMENTS

| | | |
|---|---|---|
| JP | 5-3081 A | 1/1993 |
| JP | 5-258860 A | 10/1993 |
| JP | 6-151061 A | 5/1994 |
| JP | 6-347617 A | 12/1994 |
| JP | 10-321371 A | 12/1998 |
| JP | 11-214162 A | 8/1999 |
| JP | 11-214163 A | 8/1999 |
| JP | 11-283751 A | 10/1999 |
| JP | 11-316376 A | 11/1999 |
| JP | 2001-203074 A | 7/2001 |
| JP | 2001-313178 A | 11/2001 |
| JP | 2001-356207 A | 12/2001 |

OTHER PUBLICATIONS

M.H.Lu et al, (J.Appl. Phys. vol.. 91, No. 2, pp 595-604, Jan. 2002).

J.McElvain et al, (J. Appl. Phys. vol. 80, No. 10, pp 602-607, Nov. 1996).

Junji Kido et al., (Jpn. J. Appl. Phys. vol. 32, Part. 2. No. 7A, pp. L917-L920 Jul. 1993).

J.McElvain et al, (J. Appl. Phys. vol. 80, No. 10, pp 6002-6007, Nov. 1996).

ORGANIC ELECTROLUMINESCENCE DEVICE, PLANAR LIGHT SOURCE AND DISPLAY DEVICE USING THE SAME

The present application is based on Japanese Patent Applications No. 2003-101442 and 2003-102458, which are incorporated herein by reference.

BACKGROUND OF THE INVENTION

1. Field of the Invention

The present invention relates to a color conversion type organic electroluminescence device for extracting excited light of a luminescent material as external light by using luminescence radiated from an emitting layer as an excitation light source. Particularly it relates to an organic electroluminescence device by which luminescence as natural light radiated from an emitting layer can be extracted as polarized light rich in linearly polarized light and which is excellent in efficiency of extracting the luminescence. It also relates to a high-efficient (polarizing-type) planar light source and a high-efficient display device both using the organic electroluminescence device.

2. Description of the Related Art

An electroluminescence device or a light-emitting diode in which an emitting layer is provided between electrodes to obtain luminescence electrically has been researched and developed actively not only for application to a display device but also for application to various types of light sources such as a flat illuminator, a light source for optical fiber, a backlight unit for liquid crystal display, a backlight unit for liquid crystal projector, etc. Particularly, an organic electroluminescence device has attracted public attention in recent years because it is excellent in luminous efficiency, low-voltage drive, lightweight and low cost. A primary concern to the purpose of application to these light sources is enhancement in luminous efficiency. Improvement in cell structure, material, drive method, production method, etc. has been examined to obtain luminous efficiency equivalent to that of a fluorescent lamp.

In an inter-solid luminescent element such as an organic electroluminescence device in which luminescence is extracted from an emitting layer per se, however, light generated at an angle not lower than a critical angle decided on the basis of the refractive index of the emitting layer and the refractive index of an emergence medium is totally reflected and confined in the inside, so that the light is lost as guided light. According to calculation based on classical laws of refraction (Snell's law), light-extracting efficiency $\eta$ in taking out generated light to the outside can be given by the approximate expression $\eta=1/(2n^2)$ in which n is the refractive index of the emitting layer. Assuming that the refractive index of the emitting layer is 1.7, then 80% or more of the light is lost as guided light, that is, as a loss in a side face direction of the cell because $\eta$ is nearly equal to 17%.

In the organic electroluminescence device, excitons contributing to luminescence are only singlet excitons among excitons generated by recombination of electrons and holes injected from the electrodes. The probability that singlet excitons will be generated is ¼. That is, even in the case where only such a thing is considered, the efficiency is very low to be not higher than 5%.

As a technique for improving the luminous efficiency of the emitting layer per se, development of a luminescent material (JP-A-2001-313178) for generating light also from phosphorescence due to triplet excitons has advanced in recent years, so that the possibility that quantum efficiency can be improved remarkably has been found. Even if quantum efficiency were improved, luminous efficiency is reduced in accordance with light-extracting efficiency multiplied by the quantum efficiency. In other words, if light-extracting efficiency can be improved, there is room for remarkable improvement in luminous efficiency according to the synergy between the quantum efficiency and the light-extracting efficiency.

As described above, in order to take out guided light to the outside, a region for disturbing an angle of reflection/refraction need to be formed between the emitting layer and an emergence surface to destroy Snell's law to thereby change an angle of transmission of light originally totally reflected as guided light or beam-condensing characteristic need to be given to luminescence per se. It is however not easy to form such a region that outputs all guided light to the outside. Therefore, a proposal for taking out guided light as much as possible has been made.

For example, as techniques for improving light-extracting efficiency, there have been proposed a method in which beam-condensing characteristic is given to a substrate per se to improve light-extracting efficiency (JP-A-63-314795), a method in which an emitting layer is made of discotic liquid crystal to improve frontal directivity of generated light per se (JP-A-10-321371) and a method in which a stereostructure, an inclined surface, a diffraction grating, etc. are formed in the cell per se (JP-A-11-214162, JP-A-11-214163 and JP-A-11-283751).

These proposals, however, have a problem on complication in structure, reduction in luminous efficiency of the emitting layer per se, etc.

As a relatively simple technique, there has been also proposed a method in which a light-diffusing layer is formed to change an angle of refraction of light to thereby reduce light satisfying the condition of total reflection.

For example, there have been proposed various methods such as a method using a diffusing plate having a transparent substrate, and particles dispersed in the transparent substrate so as to form such a distributed index structure that the refractive index of the inside is different from the refractive index of the outside (JP-A-6-347617), a method using a diffusing member having a light-transmissive substrate, and a single particle layer arranged on the light-transmissive substrate (JP-A-2001-356207), and a method in which scattering particles are dispersed in the same material as that of the emitting layer (JP-A-6-151061).

These proposals have been provided by finding features in the characteristic of scattering particles, the refractive index-difference from a distribution matrix, the dispersing form of particles, the place for formation of the scattering layer, and so on.

Incidentally, the organic electroluminescence device uses such a principle that holes injected from the anode and electrons injected from the cathode by application of an electric field are recombined into excitons to generate luminescence from a fluorescent (or phosphorescent) substance. It is therefore necessary to perform the recombination efficiently in order to improve quantum efficiency. As this technique, there is generally used a method in which the cell is formed as a laminated structure. For example, a two-layer structure having a hole transport layer and an electron transport emitting layer or a three-layer structure having a hole transport layer, an emitting layer and an electron transport layer is used as the laminated structure. There have been also various proposals for a laminated cell formed as a double hetero structure in order to improve efficiency.

In such a laminated structure, recombination is substantially concentrated in a certain region.

For example, in the two-layer type organic electroluminescence device, as shown in FIG. 12, recombination is concentrated in an electron transport emitting layer side region 6 which is about 10 nm distant from an interfacial layer between a hole transport layer 4 and an electron transport emitting layer 5 which are sandwiched between a pair of electrodes constituted by a reflective electrode 3 and a transparent electrode 2 on a support substrate 1 (as reported by Takuya, Ogawa et al, "IEICE TRANS ELECTRON" Vol. E85-C, No. 6, p. 1239, 2002).

Light generated in the emitting region 6 is radiated in all directions. Consequently, as shown in FIG. 13, an optical path difference is produced between light radiated toward a light-extracting surface on the transparent electrode 2 side and light radiated toward the reflective electrode 3, reflected by the reflective electrode 3 and radiated toward the light-extracting surface.

In FIG. 13, the thickness of the electron transport emitting layer in the organic electroluminescence device is generally in a range of from tens of nm to a hundred and tens of nm, that is, the order of wavelength of visible light. Accordingly, light beams finally coming out of the cell interfere with each other. The interference becomes destructive or constructive according to the distance d between the emitting region and the reflective electrode.

Although only light radiated in a frontal direction is shown in FIG. 13, light radiated in oblique directions is also present actually. The condition of interference varies according to the angle of radiated light in addition to the distance d and the wavelength $\lambda$ of generated light. As a result, there may occur the case where light beams radiated in a frontal direction interfere with each other constructively but light beams radiated in a wide-angle direction interfere with each other destructively, or there may occur the case reverse to the aforementioned case. That is, luminance of generated light varies according to the viewing angle. It is a matter of course that the intensity of light varies remarkably according to the angle as the distance d increases. Therefore, the thickness of the electron transport emitting layer is generally selected so that the distance d is made equal to about a quarter of the wavelength of generated light to obtain constructive interference of light in the frontal direction.

When, for example, the distance d is smaller than about 50 nm, absorption of light becomes remarkable in the reflective electrode generally made of a metal. This causes reduction in intensity of generated light and influence on intensity distribution. That is, in the organic electroluminescence device, the distribution of radiated light varies remarkably according to the distance d between the emitting region and the reflective electrode, so that the guided light component varies widely according to the variation in the distribution of radiated light.

Furthermore, the emission spectrum of the organic electroluminescence device has broad characteristic in a relatively wide wavelength range. Accordingly, variation in the wavelength range for constructive interference of light according to the distance d causes variation in peak wavelength of generated light. Furthermore, the emission spectrum varies according to the viewing angle in addition to the distance d.

To solve these problems, there has been made a proposal for selecting the film thickness to suppress a phenomenon that the color of generated light varies according to the viewing angle (see Patent Document 1). In this proposal, however, there is no description concerning guided light. It is obvious that the film thickness range selected by this proposal for suppressing the dependence of the color of generated light on the viewing angle is different from the range according to the invention which will be described later.

For the aforementioned reason, the light-extracting efficiency of the laminated organic electroluminescence device cannot be calculated correctly on the classical assumption that about 80% of generated light is confined as guided light in the inside of the cell. That is, the guided light component varies remarkably according to the structure of the cell. For example, as reported by M. H. Lu et al (J. Appl. Phys., Vol. 91, No. 2, p. 595, 2002), detailed research on change in the guided light component according to the structure of the cell has been made on the basis of a quantum-mechanical calculation method in consideration of a micro-cavity effect.

Accordingly, there is a possibility that the obtained effect will not be so large as estimated by the classical theory even in the case where a light-diffusing layer or the like is formed in order to destroy the condition of total reflection.

On the other hand, there has been proposed a color conversion technique in which a luminescent material for generating fluorescence in a visible light range when absorbing luminescence generated from an organic electroluminescence device is used as a filter (see Patent Documents 2 and 3). In this technique, arbitrary visible light such as white light can be extracted as generated light when the kind of luminescent material, the amount of addition of luminescence material, the mixture ratio of materials, etc. are adjusted. Furthermore, when full color display needs to be achieved in a display device, it is generally necessary to form red, green and blue organic luminescence layers in accordance with each pixel. In the aforementioned technique, full color display can be achieved when all pixels are formed as an organic electroluminescence layer while a color filter separately painted with red, green and blue luminescent materials is used separately. As a method for producing the color filter, a conventional technique cultivated for producing a color filter used for a liquid crystal display device can be applied as it is. Reduction in production cost can be also made.

When the luminescent material absorbs excitation light from the organic electroluminescence device and generates light, the situation that large part of the generated light is confined as guided light in the inside of the cell is however unchanged because the light is generated in a solid, in addition to lowering of efficiency due to light conversion efficiency. On the contrary, when a conventional technique in which particles different in refractive index from the matrix are dispersed in the region of the dispersed luminescent material or a conventional technique in which a light-diffusing layer or a lens sheet is formed on the luminescent material is used, guided light can be extracted to the outside to a certain degree.

When the organic electroluminescence device is used as a backlight unit for a liquid crystal display device, luminescence radiated from the cell need to be converted into linearly polarized light by a polarizing plate for the purpose of liquid crystal display because the luminescence is natural light. As a result, absorption loss due to the polarizing plate is produced. There is a problem that the rate of utilization of light cannot be set to be higher than 50%.

As a technique for solving this problem, there has been made a proposal for forming an organic electroluminescence device layer on an oriented film to take out luminescence per se as linearly polarized light (see Patent Document 4).

Although the absorption loss due to the polarizing plate can be reduced to half, at the most, by this proposal, there is a possibility that the luminous efficiency of the cell will be lowered because of the insertion of the oriented film etc. for orienting an organic thin film. In addition, like the background-art cell, the problem of guided light due to total reflection cannot be solved at all by this proposal. Even if a light-diffusing layer were formed in such a linearly polarized light-emitting cell, the linearly polarized light will be scattered and converted into natural light nonsensically.

The applicant of the present invention has already proposed a method in which light generated in an organic electroluminescence device is extracted through a polarizing/scattering film (see Patent Document 5). According to this proposal, light lost as guided light can be scattered so as to be extracted, and output light can be extracted as polarized light which is rich in linearly polarized light. Accordingly, the absorption loss due to the polarizing plate can be reduced, so that a polarizing-type planar light source of high efficiency can be provided as a light source for a liquid crystal display device.

For example, the relation between the guided light and the influence of the distance between the emitting region and the reflective electrode on interference has not been described yet in this proposal. It cannot be said that this proposal brings out the greatest possible effect of the light source for a liquid crystal display device.

As described above, no report in the background art gives attention to detailed examination of improvement in light-extraction efficiency on the assumption that detailed research is made on change in guided light component in accordance with the cell structure while the characteristic of the color conversion technique that arbitrary visible light can be obtained as polarized light is used. Therefore, the provision of a polarizing-type planar light source of high efficiency best adapted to a liquid crystal display device using polarized light is desired earnestly in the existing circumstances.

[Patent Document 1]
JP-A-5-3081
[Patent Document 2]
JP-A-3-152897
[Patent Document 3]
JP-A-5-258860
[Patent Document 4]
JP-A-11-316376
[Patent Document 5]
JP-A-2001-203074

SUMMARY OF THE INVENTION

Upon such circumstances, an object of the invention is to provide an organic electroluminescence device in which loss light confined as guided light in the inside of the cell in the background art can be extracted efficiently as arbitrary light by a color conversion technique, preferably, as polarized light which is rich in linearly polarized light. Another object of the invention is to provide a planar light source and a display device of high efficiency using the organic electroluminescence device.

The inventors have made examination earnestly to solve the problem.

FIG. 11 is a schematic view showing the case where light generated in the emitting layer 6 of the two-layer type organic electroluminescence device depicted in FIG. 12 is extracted from the cell. Although only light radiated toward an upper semispherical surface is shown in FIG. 6, light radiated toward the reflective electrode 3 is not shown in FIG. 6 but actually present.

In FIG. 11, the critical angle decided on the basis of the difference between the refractive index of a support substrate (glass substrate) 1 and the refractive index of an air layer is about 40 degrees. That is, light having an angle greater than 40 degrees is totally reflected by the glass/air interface so as to be confined as guided light in the inside of the cell. Although about 45% of light calculated by 40 degrees per 90 degrees appears to be extracted from the cell in FIG. 11, actually generated light is radiated in all directions. For this reason, solid angles are decided so that the intensity of a light component becomes higher as the angle of the light component becomes wider. For this reason, the luminous efficiency calculated according to the classical theory is not higher than 20%.

When a color conversion layer impregnated with a luminescent material is provided on the support substrate (glass substrate) 1 so that the generated light radiated as described above can be made incident on the color conversion layer, the luminescent material absorbs the generated light as an excitation light source and generates fluorescence or phosphorescence. The color of the generated fluorescence or phosphorescence can be selected at option when the kind of the luminescent material used is changed. A plurality of luminescent materials may be used so that white light can be obtained when the amounts of the luminescent materials are adjusted.

If the color conversion layer impregnated with the luminescent material is provided as a general region which does not disturb an angle of reflection/refraction of light, generated light will be totally reflected by the air layer surface so that the light will be lost as guided light in the same manner as in the background art.

The inventors however have found the following fact. That is, when the color conversion layer is particularly formed as a light-scattering color conversion layer so that the color conversion later can serve as a region for disturbing the angle of reflection/refraction of light, light generated by excitation is scattered in a process before the light emerges from the cell to the outside. As a result, the angle of transmission of the light is changed so that wide-angle light originally confined in the inside of the cell can emerge from the cell to the outside because the condition of total reflection of the light is destroyed. On the other hand, part of light scattered to satisfy the condition of total reflection is totally reflected by the air layer surface, so that the part of light returns to the inside of the cell. While scattering of the part of light is repeated in this manner, the angle of transmission of the part of light becomes contrary to the condition of total reflection. As a result, the part of light can finally emerge from the cell to the outside.

On the other hand, in the actual organic electroluminescence device, an effect of interference of light occurs. As measures against the interference of light in the background art, the configuration of the cell is generally decided so that frontal light beams capable of being extracted to the outside interfere with each other constructively. In this case, guided light beams conversely interfere with each other destructively. The inventors however have found that when the configuration of the cell is decided intentionally in a different manner from the background art such that frontal light beams interfere with each other destructively but light beams as a wide-angle component originally confined as guided light in the inside of the cell interfere with each other constructively, that is, when wide-angle light in which a large part of light intensity is distributed in terms of solid angles is amplified so as to be made incident on the light-scattering color conversion layer, luminous efficiency of the cell is improved remarkably.

It has been found that when the light-scattering color conversion layer is provided in this manner after the cell configuration is formed so intentionally that luminous efficiency of the general organic electroluminescence device is lowered, an organic electroluminescence device of high efficiency can be finally obtained because organic electroluminescence generated as excitation light can be used to the full so that light generated by excitation light can be extracted to the outside efficiently.

The biggest weakness of the background-art organic electroluminescence device is that the cell deteriorates on contact with a small amount of moisture or oxygen. For this reason, there is a problem that dark spots are produced with fine defects as start points, to say nothing of reduction in luminous efficiency. It has been however found that this problem can be avoided by the inventors' cell configuration.

Such dark spots have been described in detail, for example, as reported by J. McElvain et al. (J. Appl. Phys., Vol. 80, No. 10, p. 6002, 1996). Although the cell is generally perfectly sealed in order to avoid this problem, it is still not easy to prevent the production of dark spots perfectly. The dark spots remarkably reduce the external appearance and visibility of a planar light source or a display device. In the cell configuration proposed by the inventors, there can be however obtained such an effect that lowering of visibility caused by the production of dark spots becomes almost inconspicuous even if the dark spots were more or less produced, because a large part of light finally extracted toward the observer side is light generated by the excited luminescent material dispersed in the light-scattering color conversion layer and because the light emerges from the cell to the outside after scattering of the light is repeated.

The invention is accomplished on the basis of the aforementioned knowledge.

That is, the invention according to a first aspect provides an organic electroluminescence device (hereinafter merely referred to as "organic EL cell") having at least one organic layer and a pair of electrodes, the organic layer including an emitting layer being sandwiched between the pair of electrodes, the pair of electrodes being provided as a reflective electrode and a transparent electrode respectively, the organic electroluminescence device being formed to satisfy the expression (1) : $B_0 < B_\theta$ in which $B_0$ is a normal luminance intensity of luminescence radiated from a light extraction surface to an observer side, and $B_\theta$ is a luminance intensity of the luminescence at an angle of 50° to 70°, wherein: a region for disturbing an angle of reflection/refraction of light is provided in an optical path in which the luminescence is output from the emitting layer to the observer side through the transparent electrode; and at least one kind of luminescent material is contained in the region or between the region and the emitting layer so that the luminescent material generates fluorescence or phosphorescence when the luminescent material absorbs the luminescence radiated from the emitting layer as an excitation light source.

In an especially preferred embodiment of the organic EL cell according to the invention, the organic EL cell satisfies the expression (2): $(0.3/n)\lambda < d < (0.5/n)\lambda$ in which d (nm) is a distance between a center portion of a hole-electron recombination emitting region and the reflective electrode, $\lambda$ (nm) is a peak wavelength of a fluorescence spectrum of a material used in the emitting layer, and n is a refractive index of the organic layer between the emitting layer and the refractive electrode.

The invention further provides an organic EL cell configured as described above, wherein the region for disturbing the angle of reflection/refraction of light is constituted by a light-diffusing site containing a transparent material, and a transparent or opaque material different in refractive index from the transparent material and dispersed/distributed in the transparent material. The invention further provides an organic EL cell configured as described above, wherein the region for disturbing the angle of reflection/refraction of light is constituted by a lens structure. The invention further provides an organic EL cell configured as described above, wherein the region for disturbing the angle of reflection/refraction of light is constituted by a uneven surface.

Further, the inventors have tried forming an anisotropic scattering color conversion layer substantially without interposition of any air layer on the light-extraction surface side of the support substrate (glass substrate) 1, that is, on a side opposite to the transparent electrode 2 in the organic electroluminescence device. The anisotropic scattering color conversion layer has an anisotropic scattering resin layer, and a luminescent material contained in the anisotropic scattering resin layer. The anisotropic scattering resin layer has a light-transmissive resin, and micro domains dispersed/distributed in the light-transmissive resin and different in birefringence characteristic. The inventors have then examined a state in which light generated in the emitting region 6 is extracted from the cell in the aforementioned condition. This anisotropic scattering resin layer is one of specific examples of the aforementioned region for disturbing the angle of reflection/refraction of light.

An upper hemispherical part of generated light passes through the transparent electrode and the glass substrate and reaches the anisotropic scattering color conversion layer. On the other hand, a lower hemispherical part of generated light is reflected by the cathode and then reaches the anisotropic scattering color conversion layer in the same manner as described above. Because there is no air layer (refractive index=1) of a low refractive index provided in this process, the generated light is not totally reflected but can reach the anisotropic scattering color conversion layer. (Incidentally, part of the generated light may be totally reflected in accordance with the refractive indices of the transparent electrode and the glass substrate.) As shown in FIG. 11, in a general cell, light having an angle not lower than the critical angle decided on the basis of the difference between the refractive index of the glass substrate and the refractive index of the air layer is totally reflected and lost as guided light, so that only about 20% of generated light is generally extracted from the cell.

The generated light which has reached the anisotropic scattering color conversion layer without influence of total reflection is selected to be in a wavelength range of light for exciting the luminescent material. For this reason, the luminescent material absorbs the incident generated light and generates fluorescence or phosphorescence. In this process, the excitation light is generated from the organic electroluminescence device so that light loss due to total reflection is minimized. The color of the generated fluorescence or phosphorescence can be selected at option when the kind of the luminescent material used is changed. A plurality of luminescent materials may be used so that white light can be obtained when the amounts of the luminescent materials are adjusted.

If the resin layer impregnated with the luminescent material has no anisotropic scattering characteristic, that is, when the resin layer is not provided as the region in which an angle of reflection/refraction of light is disturbed, generated light will be totally reflected by the interface between the resin layer and the air layer again as shown in FIG. 11 so that the light will be lost as guided light in the same manner as in the background art.

The resin layer impregnated with the luminescent material, however, serves as an anisotropic scattering color conversion layer. Part of the excited light generated in this layer is propagated in the anisotropic scattering color conversion layer because the part of the excited light is totally reflected in accordance with the refractive index difference between this layer and the air layer. In the propagated light, a linearly polarized light component having a plane of vibration parallel to an axial direction ($\Delta n_1$ direction) exhibiting the maximum refractive index difference ($\Delta n_1$) between the micro domains and other regions in the anisotropic scattering color conversion layer is selectively intensively scattered. As a result, the angle of part of the propagated light becomes smaller than the angle of total reflection, so that part of the propagated light emerges from the cell to the outside (air). Incidentally, if there is no micro domain so that selective scattering of polarized light does not occur, about 80% of the generated light judged from solid angles is confined in the inside of the cell while total reflection is repeated.

The confined light can emerge from the cell to the outside only when the condition of total reflection is destroyed by scattering in the interface between each micro domain and the light-transmissive resin. Accordingly, the light-extracting efficiency can be controlled optionally on the basis of the size of each micro domain and the degree of presence of the micro domains.

On the other hand, light beams scattered at large angles at the time of scattering in the $\Delta n_1$ direction, light beams satisfying the condition of the $\Delta n_1$ direction but not scattered and light beams having other directions of vibration than the $\Delta n_1$ direction are confined in the anisotropic scattering color conversion layer and propagated through the anisotropic scattering color conversion layer while total reflection is repeated. These confined light beams wait for a chance to emerge from the anisotropic scattering color conversion layer by satisfying the condition of the $\Delta n_1$ direction in such a manner that the polarized state is eliminated by birefringence phase difference or the like. By the repetition of the aforementioned operation, linearly polarized light having a predetermined plane of vibration can emerge from the anisotropic scattering color conversion layer efficiently. That is, light originally confined as guided light can be finally extracted as a linearly polarized light component.

Hence, according to this method, the luminescent material can be excited by excitation light incident on the anisotropic scattering color conversion layer without provision of any special light output means such as microlenses or reflecting dots so that the luminescent material can efficiently generate light with no light loss caused by total reflection. Moreover, all the light generated by the excited luminescent material can emerge, as polarized light rich in its linearly polarized light component, from the anisotropic scattering color conversion layer to the outside efficiently because the condition of total reflection can be destroyed. In addition, the direction of vibration of linearly polarized light can be changed optionally by the angle at which the anisotropic scattering color conversion layer is set. Accordingly, when the organic electroluminescence device is used as a backlight unit for a liquid crystal display device, electric power consumption can be reduced.

The inventors have further made research to improve luminous efficiency.

As described above, in the actual organic electroluminescence device, an effect of interference of light occurs as shown in FIG. 13. In the general organic electroluminescence device, the cell structure is generally decided so that constructive interference of light is obtained in the frontal direction in which the light can emerge from the cell to the outside. In this case, guided light beams conversely interfere with each other destructively.

The inventors, however, have found that luminous efficiency can be improved compared with the background-art method when the anisotropic scattering color conversion layer is integrally formed without interposition of any air layer in addition to amplifying wide-angle light having a large part of light intensity distributed therein on the basis of the relation of solid angles by deciding the cell structure intentionally to obtain destructive interference of light radiated in the frontal direction and constructive interference of the wide-angle light component usually confined as guided light in the inside of the cell.

That is, when the anisotropic scattering color conversion layer is combined with the general cell which brings reduction in luminous efficiency when the general cell is used singly, organic electroluminescence light which is excitation light can be used to the full so that light generated by the excited luminescent material can be extracted, as polarized light rich in linearly polarized light, to the outside efficiently. Accordingly, when the organic electroluminescence device finally obtained is used as a backlight unit for a liquid crystal display device, luminous efficiency can be improved remarkably.

The biggest weakness of the organic electroluminescence device is that the cell deteriorates on contact with a small amount of moisture or oxygen. For this reason, there is a problem that dark spots are produced with fine defects as start points, to say nothing of reduction in luminous efficiency. Such dark spots have been described in detail as reported by J. McElvain et al. (J. Appl. Phys., Vol. 80, No. 10, p. 6002, 1996).

Although the cell is generally perfectly sealed in order to avoid this problem, it is still difficult to prevent the production of dark spots perfectly. The dark spots worsen remarkably the external appearance and visibility of a planar light source or a display device.

When the anisotropic scattering color conversion layer is formed, there can be however obtained such a very excellent effect that lowering of visibility caused by the production of dark spots becomes almost inconspicuous even if the dark spots were more or less produced, because light finally extracted toward the observer side is light which is generated by the excited luminescent material dispersed in the anisotropic scattering color conversion layer and which emerges from the anisotropic scattering color conversion layer to the outside after repeatedly scattered.

That is, the invention from a second aspect provides an organic electroluminescence device (hereinafter merely referred to as "organic EL cell") having at least one organic layer and a pair of electrodes, the organic layer including an emitting layer being sandwiched between the pair of electrodes, the pair of electrodes being provided as a reflective electrode and a transparent electrode respectively, the organic electroluminescence device being formed to satisfy the expression (1): $B_0 < B_\theta$ in which $B_0$ is a normal luminance intensity of luminescence radiated from a light extraction surface to an observer side, and $B_\theta$ is a luminance intensity of the luminescence at an angle of 50° to 70°, wherein: an anisotropic scattering resin layer containing a light-transmissive resin, and micro domains dispersed/distributed in the light-transmissive resin and different in birefringence characteristic is formed substantially without interposition of any air layer in an optical path in which the luminescence is output from the emitting layer to the observer side through the transparent electrode; and at least one kind of luminescent material is contained in the anisotropic scattering resin layer or between the anisotropic scattering resin layer and the emitting layer so that the luminescent material generates fluorescence or phosphorescence when the luminescent material absorbs the luminescence radiated from the emitting layer as an excitation light source.

In an especially preferred embodiment of the organic EL cell according to the invention, the organic EL cell satisfies the expression (2): $(0.3/n)\lambda < d < (0.5/n)\lambda$ in which d (nm) is a distance between a center portion of a hole-electron recombination emitting region and the reflective electrode, $\lambda$ (nm) is a peak wavelength of a fluorescence spectrum of a material used in the emitting layer, and n is a refractive index of the organic layer between the emitting layer and the refractive electrode.

The invention also provides an organic EL cell configured as described above, wherein the micro domains in the anisotropic scattering resin layer are made of one member selected from the group consisting of a liquid crystal material, a vitreous material having a liquid crystal phase fixed by supercooling, and a material having a liquid crystal phase of polymerizable liquid crystal fixed by crosslinking due to an energy beam. The invention further provides an organic EL cell configured as described above, wherein the micro domains dispersed in the light-transmissive resin of the anisotropic scattering resin layer are made of a liquid crystal polymer having a glass transition temperature of not lower than 50° C. to exhibit a nematic liquid crystal phase at a temperature lower than the glass transition temperature of the light-transmissive resin. The invention further provides an organic EL cell configured as described above, wherein: the anisotropic scattering resin layer exhibits refractive index differences $\Delta n_1$, $\Delta n_2$ and $\Delta n_3$ between the micro domains and other portions in directions of respective optical axes of the micro domains; and the refractive index difference $\Delta n_1$ in an axial direction ($\Delta n_1$ direction) as the highest of the refractive index differences $\Delta n_1$, $\Delta n_2$ and $\Delta n_3$ is in a range of from 0.03 to 0.5 whereas each of the refractive index differences $\Delta n_2$ and $\Delta n_3$ in two axial directions ($\Delta n_2$ direction and $\Delta n_3$ direction) perpendicular to the $\Delta n_1$ direction is not larger than 0.03.

The invention further provides a (polarizing-type) planar light source including an organic EL cell according to the first and second aspects. The invention further provides a display device including an organic EL cell configured as described above.

DETAILED DESCRIPTION OF THE PREFERRED EMBODIMENTS

Embodiments of the invention will be described below with reference to the drawings.

Figure 1:
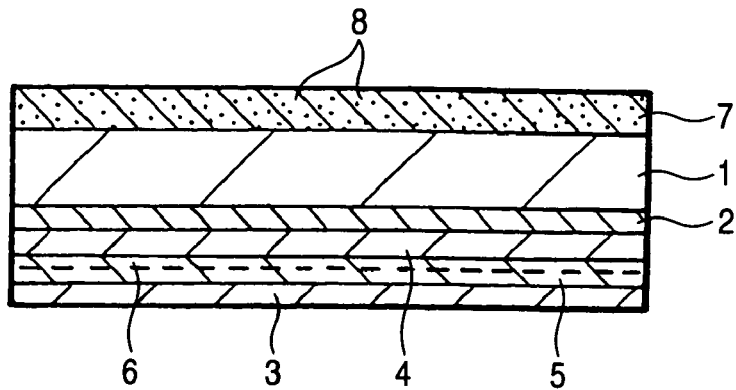
FIG. 1 is a sectional view showing an example of an organic electroluminescence device according to the invention.

FIG. 1 shows an example of a two-layer type organic EL cell according to the invention from one aspect. The cell is basically configured so that a transparent electrode 2, a hole transport layer 4, an electron transport emitting layer 5 and a reflective electrode 3 are laminated successively on a support substrate 1.

That is, the cell is configured so that an organic layer composed of a hole transport layer 4 and an electron transport emitting layer 5 as described above is sandwiched between a pair of electrodes constituted by a transparent electrode 2 and a reflective electrode 3. When a voltage is applied between the pair of electrodes at the time of operation, hole-electron recombination occurs in a region on the electron transport emitting layer side about 10 nm distant from an interfacial layer between the hole transport layer 4 and the electrode transport emitting layer 5. As a result, EL light is generated while concentrated in an emitting region 6 shown in FIG. 1.

Incidentally, another organic EL cell than the two-layer type organic EL cell, for example, a three-layer type organic EL cell having a hole transport layer, an emitting layer and an electron transport layer operates as follows. When a voltage is applied between electrodes, holes injected from the anode and electrons injected from the cathode are moved in carrier transport layers respectively and recombined in the emitting layer to produce excitons. As a result, EL light is generated in the same manner as in the two-layer type organic EL cell.

The invention is also basically configured so that light beams generated particularly in a frontal direction interfere with each other destructively but guided light beams confined in the inside of the cell interfere with each other constructively. This feature will be described with reference to FIG. 2.

Figure 2:
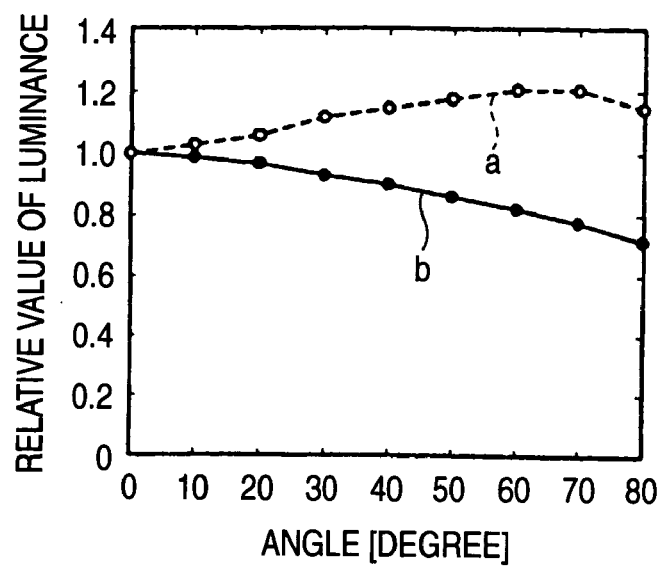
FIG. 2 is a characteristic graph showing basic configurations of organic electroluminescence devices according to the invention and the background art (before an anisotropic scattering color conversion layer is formed on each basic configuration)

FIG. 2 is a characteristic graph in the case where the angular distribution of luminance of the organic EL cell having only the basic configuration (i.e., before provision of a light-scattering color conversion layer or an anisotropic scattering color conversion layer which will be described later) is measured at intervals of 10 degrees in an angle range of from 0 degrees to 80 degrees viewed from the frontal direction. In FIG. 2, the curve a represents an organic EL cell according to the invention, and the curve b represents an organic EL cell according to the background art. In FIG. 2, luminance is expressed as a relative value on the assumption that luminance at an angle of 0 degrees viewed from the frontal direction is regarded as 1.

Incidentally, in the basic configuration, the transparent electrode 2 is 100 nm thick, the hole transport layer 4 is 40 nm thick, and the electron transport emitting layer 5 is 95 nm thick (the invention) or 60 nm thick (background art). The measurement is made in the condition that a voltage is applied between the electrodes so that the same current flows in each of the cell according to the invention and the cell according to the background art.

As is obvious from FIG. 2, the cell according to the background art exhibits such characteristic that normal luminance, that is, luminance at an angle of 0 degrees viewed from the frontal direction is high but luminance decreases as the angle increases. On the contrary, the cell according to the invention exhibits such characteristic that normal luminance is low but luminance increases as the angle increases. That is, the cell according to the invention is configured so that dependence of the luminance on the angle satisfies the expression:

$$B_0 < B_\theta \quad (1)$$

in which $B_0$ is the normal luminance intensity, and $B_\theta$ is the luminance intensity in an angle range of from 50° to 70°.

Although this example has been described on the case where the relation given by the expression (1) is achieved on the basis of variation in thickness of the electron transport emitting layer 5, the relation can be achieved optionally if the materials, thicknesses, etc. of the emitting layer 5-containing organic layer and the pair of electrodes are selected suitably.

In a preferred embodiment of the invention, the cell may be especially preferably configured to satisfy the expression:

$$(0.3/n)\lambda < d < (0.5/n)\lambda \quad (2)$$

in which d is the distance between a center portion of the hole-electron recombination emitting region 6 and the reflective electrode 3 (in this example, d is approximately equal to the thickness of the electron transport emitting layer 5), $\lambda$ is the peak wavelength of a fluorescence spectrum of a material used in the emitting layer (the electron transport emitting layer 5 in this example), and n is the refractive index of the organic layer (the electron transport emitting layer 5 in this example) between the emitting layer and the refractive electrode 3.

When, for example, the electron transport emitting layer 5 in the aforementioned example generates blue fluorescence with a peak wavelength of 450 nm and has a refractive index of 1.65, the distance d is preferably selected to be in a range of from 81.8 nm to 136.4 nm.

In addition to the basic configuration satisfying the expression (1) and preferably the expression (2), according to the invention, a region 7 for disturbing the angle of reflection/refraction of light is further provided between the emitting layer and an emergence medium on the observer side without interposition of any air layer, and that at least one kind of luminescent material 8 capable of generating fluorescence or phosphorescence when absorbing light radiated from the emitting layer as an excitation light source is contained in the region 7 so that the region 7 can serve as a light-scattering color conversion layer.

In this configuration, upper hemispherical part of light generated and radiated from the emitting layer passes through the transparent electrode and the support substrate and reaches the light-scattering color conversion layer. On the other hand, lower hemispherical part of light is reflected by the reflective electrode and then reaches the light-scattering color conversion layer in the same manner as described above. Because there is no air layer of a low refractive index (=1) in this process, the generated light can enter the light-scattering color conversion layer without the influence of total reflection. (Part of the light may be totally reflected according to the refractive indices of the transparent electrode and the support substrate.)

The light incident on the light-scattering color conversion layer serves as a light source for exciting the luminescent material contained in the light-scattering color conversion layer, so that the light is absorbed to the luminescent material. As a result, the luminescent material generates fluorescence or phosphorescence. On this occasion, loss of excitation light due to total reflection is minimized. The color of the fluorescence or phosphorescence generated by the luminescent material can be selected at option when the kind of the luminescent material is changed. When a plurality of luminescent materials are used while the amounts of the luminescent materials added are adjusted, white light can be obtained as generated light.

The light generated by excitation is scattered in the process before the light emerges from the cell to the outside. As a result, the angle of transmission of light is changed so that the wide-angle light originally confined in the inside of the cell can be extracted from the cell to the outside because the condition of total reflection is destroyed. The other part of light scattered to satisfy the condition of total reflection is totally reflected by the air layer surface and returned to the inside of the cell. While scattering of the other part of light is repeated in this manner, the angle of transmission of the light is changed so as not to satisfy the condition of total reflection. As a result, the other part of light also emerges from the cell to the outside.

As described above, the organic EL cell is basically configured so intentionally that frontal light components radiated from the emitting layer interfere with each other destructively but wide-angle light components originally confined as guided light in the inside of the cell interfere with each other constructively. That is, the organic EL cell is configured so that light is made incident on the light-scattering color conversion layer without interposition of any air layer after wide-angle light components in which a large part of light intensity is distributed are amplified. Accordingly, the luminous efficiency of light generated by excitation and finally extracted to the outside in this manner is very high compared with the background art.

Basically, the method for forming the region 7 for disturbing the reflection/refraction angle of the light is not particularly limited if the angle of transmission of light satisfying the condition of total reflection can be efficiently disturbed so as not to satisfy the condition of total reflection with the result that a more quantity of the guide light confined in the inside of the cell can be extracted from the cell to the outside. For example, a method proposed in the background art can be applied as it is.

For example, a light-diffusing site containing a transparent material, and a transparent or opaque material different in refractive index from the transparent material and dispersed/distributed into the transparent material may be formed as shown in FIG. 1. Specifically, when a glass or polymer material is used as the transparent material in the light-diffusing site, the transparent or opaque material dispersed/distributed into the glass or polymer material can be selected from silica particles, titania particles, zirconia particles, plastic particles, liquid crystal particles, air particles, etc.

The refractive indices of the two materials, the refractive index difference between the two materials and the particle size of the particles are not particularly limited. It is preferable from the point of view of light scattering that the particle size is in a range of from 0.1 µm to 10 µm and the refractive index difference is not smaller than 0.05.

A lens structure can be also preferably used. The lens structure means a thin plate-like transparent substance which has a plurality of lenses, prisms or V-grooves arranged or formed into concentric circles, lines parallel to one another or grids and in which the direction of light advancing straight is changed by the plurality of lenses, prisms or V-grooves. Specifically, examples of the lens structure include a lenticular lens sheet, a Fresnel lens sheet, a corner cube lens sheet, a fly's eye lens sheet, a cat's eye lens sheet, a double fly's eye lens sheet, a double lenticular lens sheet, a radial lenticular lens sheet, a prism lens film, a micro-prism lens film, a lens sheet obtained in such a manner that the convex surfaces of any one of the aforementioned lens sheets are converted into concave surfaces, and a sheet of transparent or semitransparent spheres arranged in a plane. Alternatively, grooves such as V-grooves may be formed so that the direction of light can be changed. The material of each lens sheet may be glass or resin.

A surface of the support substrate or each interface may be formed as a physically uneven surface. Specifically, the uneven surface may be formed by means of matting a surface of the support surface or by means of thermally transferring a periodic uneven structure onto a surface of the organic layer (polymer layer).

In the invention, the position where the region 7 for disturbing the angle of reflection/refraction of light is formed is not particularly limited. The region 7 can be formed in any position.

For example, a diffusing film may be stuck onto a surface of the support substrate 1 through a pressure-sensitive adhesive or adhesive agent to thereby form the region 7, light-diffusing characteristic may be given to the support substrate 1 per se to thereby form the region 7, or the region 7 may be formed between the transparent electrode 2 and the support substrate 1. When the cell is used for illumination requiring a relatively large emission area, the region 7 may be preferably formed on a surface of the substrate. When the cell is applied to a display device requiring a small emission area, the region 7 may be preferably formed in a position as near to the emitting layer as possible to reduce parallax error between the transmission distance to the emitting layer and the transmission distance to the region for disturbing the angle of reflection/refraction of light.

In the invention, as shown in FIG. 1, the luminescent material 8 can be provided in the inside of the region 7 for disturbing the angle of reflection/refraction of light on the support substrate 1 to thereby form the light-scattering color conversion layer. The luminescent material 8 may be further provided as a color conversion layer having no light scattering characteristic in any suitable place between the region 7 and the emitting layer. It is preferable that the luminescent material is evenly dissolved or dispersed in these color conversion layers.

Figure 3:
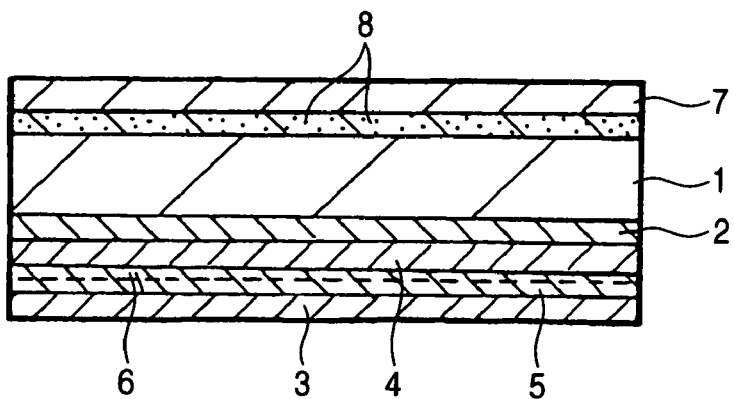
FIG. 3 is a sectional view showing another example of the organic electroluminescence device according to the invention.
Figure 4:
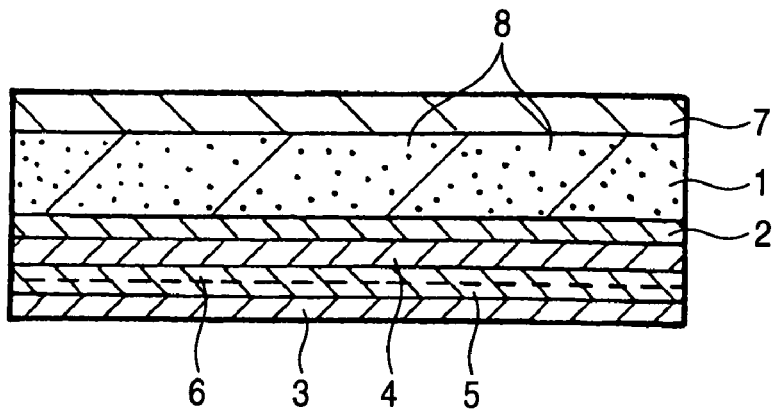
FIG. 4 is a sectional view showing a further example of the organic electroluminescence device according to the invention.

FIGS. 3 and 4 show the aforementioned example. FIG. 3 shows the case where the color conversion layer containing the luminescent material 8 is provided between the support substrate 1 and the region 7 for disturbing the angle of reflection/refraction of light. FIG. 4 shows the case where the luminescent material 8 is contained in the support substrate 1 so that the support substrate 1 per se serves as a color conversion layer. In FIGS. 3 and 4, other parts are the same as those shown in FIG. 1 and referred to by numerals the same as those in FIG. 1 for the sake of omission of duplicated description. The same effect as in the aforementioned case can be also obtained when either of these configurations is used.

One luminescent material may be contained both in the inside of the region 7 for disturbing the angle of reflection/refraction of light and in any place between the region 7 and the emitting layer or different luminescent materials may be contained in the two places respectively. Further, layers containing different luminescent materials respectively may be laminated. That is, the form for providing the luminescent material can be selected at option. For example, films each containing a transparent resin and a luminescent material dispersed in the transparent resin may be stuck onto one another to form a laminated structure. For example, luminescent materials dissolved in solvents respectively may be applied to the transparent resin to form a laminated structure. These respective layers may be laminated directly or bonded to one another through a transparent pressure-sensitive adhesive or adhesive agent. Further, each luminescent material may be contained in the pressure-sensitive adhesive or adhesive agent.

Figure 5:
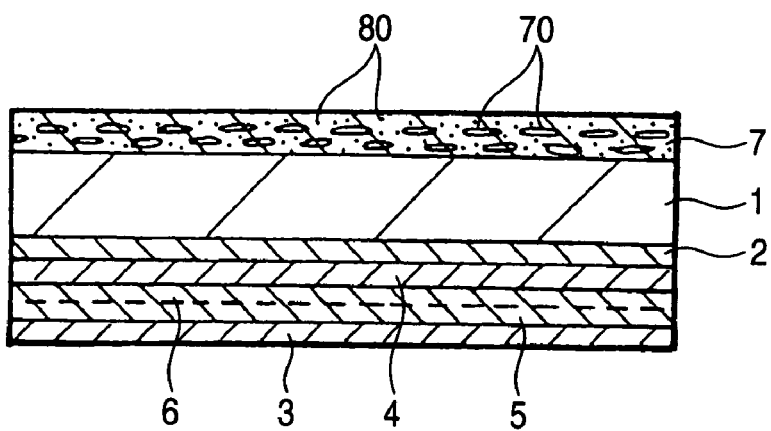
FIG. 5 is a sectional view showing a still further example of the organic electroluminescence device according to the invention.

In addition to the basic configuration satisfying the expression (1) and preferably the expression (2), as shown in FIG. 5, the feature of the invention from another aspect is in that an anisotropic scattering resin layer 7 containing a light-transmissive resin, and micro domains 70 dispersed/distributed in the light-transmissive resin and different in birefringence characteristic is particularly provided on the light-extracting surface side of the support substrate 1 substantially without interposition of any air layer so that the anisotropic scattering resin layer 7 serves as a region for disturbing the angle of reflection/refraction of light while generated light is output from the electron transport emitting layer 5 toward the observer side through the transparent electrode 2. Another feature of the invention is in that the resin layer 7 serves as an anisotropic scattering color conversion layer in such a manner that the resin layer 7 is impregnated with at least one kind of luminescent material 80 which generates fluorescence or phosphorescence when the luminescent material 80 absorbs light generated and radiated from the emitting layer as an excitation light source. This anisotropic scattering resin layer 7 is one of specific examples of the aforementioned region 7 for disturbing the angle of reflection/refraction of light.

According to this configuration, as described above, the guided light component originally confined in the inside of the cell is amplified so as to enter the anisotropic scattering color conversion layer without interposition of any air layer, so that the light acts effectively as a light source for exciting the luminescent material contained in the anisotropic scattering color conversion layer. Accordingly, when the kind of the luminescent material and the amount of the luminescent material added are adjusted, an arbitrary emission color such as white can be obtained efficiently. Moreover, the micro domains in the anisotropic scattering color conversion layer operate so that the light generated by excitation is not confined in the inside of the cell but can be extracted as polarized light rich in linearly polarized light. The direction of vibration of the linearly polarized light can be changed optionally on the basis of the angle at which the anisotropic scattering color conversion layer is set. For this reason, when the cell is used in a liquid crystal display device or the like, electric power consumption can be reduced greatly and the operating voltage or the cell current can be reduced to improve the life of the cell greatly. In addition, the cell is effective in substantially eliminating the influence of dark spots.

Although FIG. 5 shows the case where the anisotropic scattering resin layer 7 constituting the anisotropic scattering color conversion layer is provided on the light-extracting surface side of the support substrate 1, the invention is not limited thereto. For example, the anisotropic scattering resin layer 7 may be provided between the support substrate 1 and the transparent electrode 2. In short, the aforementioned effect can be obtained if the anisotropic scattering resin layer 7 is provided in any place of an optical path in which generated light is extracted to the observer side through the transparent electrode 2.

The shape of the anisotropic scattering resin layer 7 is not particularly limited if the anisotropic scattering resin layer 7 has at least two flat surfaces opposite to each other. From the point of view of use as a planar light source and efficiency in total reflection, a film shape, a sheet shape or a plate shape can be preferably used. Especially, a film shape is preferred from the point of view of easiness in handling property. The thickness of the anisotropic scattering resin layer 7 is selected to be preferably not larger than 10 mm, more preferably in a range of from 0.1 mm to 5 mm, most preferably in a range of from 0.4 mm to 2 mm.

The two flat surfaces opposite to each other may be preferably selected to be smooth surfaces as near to mirror surfaces as possible from the point of view of efficiency in confinement of generated light due to total reflection. When the two opposite surfaces of the anisotropic scattering resin layer 7 lack smoothness, a light-transmissive film or sheet excellent in smoothness and provided separately may be stuck to the anisotropic scattering resin layer 7 through a transparent adhesive or pressure-sensitive adhesive agent so that the interface of total reflection can be provided as a smooth surface of the stuck light-transmissive film or sheet in order to obtain the same effect.

The anisotropic scattering resin layer 7 can be formed by a suitable method such as a method of obtaining an oriented film by using one kind or two or more kinds of suitable materials such as polymers and liquid crystal materials excellent in transparency in combination to form regions different in birefringence characteristic by a suitable orienting process such as a stretching process.

Incidentally, when a luminescent material is contained in the anisotropic scattering resin layer, it is preferable that the luminescent material is dispersed in a size as small as possible, and it is preferable that at least one of the aforementioned materials of the anisotropic scattering resin layer and the luminescent material are mixed so as to be mutually soluble in each other well.

Examples of the combination include combination of a polymer and a liquid crystal material, combination of an isotropic polymer and an anisotropic polymer, and combination of anisotropic polymers. From the point of view of the dispersion/distribution of micro domains, such a combination as brings phase separation is preferred. The dispersion/distribution can be controlled on the basis of mutual solubility of materials combined. The phase separation can be performed by a suitable method such as a method of dissolving mutually insoluble materials in a solvent or a method of mixing mutually insoluble materials while thermally melting the mutually insoluble materials.

The combined materials can be oriented by a stretching process as follows. In the combination of a polymer and a liquid crystal material or in the combination of an isotropic polymer and an anisotropic polymer, when the stretching temperature and the magnification of stretching are selected desirably, an aimed anisotropic scattering resin layer can be formed. In the combination of anisotropic polymers, when the stretching condition is controlled suitably, an aimed anisotropic scattering resin layer can be formed.

Incidentally, anisotropic polymers are classified into positive and negative groups by characteristic of change in refractive index in the stretching direction. In the invention, either of positive and negative anisotropic polymers can be used. Positive anisotropic polymers or negative anisotropic polymers may be combined. Or a positive anisotropic polymer and a negative anisotropic polymer may be combined.

Examples of the polymer include: ester polymer such as polyethylene terephthalate, and polyethylene naphthalate; styrene polymer such as polystyrene, and acrylonitrile-styrene copolymer; olefin polymer such as polyethylene, polypropylene, cyclo or norbornene structure-containing polyolefin, and ethylene-propylene copolymer; acrylic polymer such as polymethyl methacrylate; cellulose polymer such as cellulose diacetate, and cellulose triacetate; and amide polymer such as Nylon, and aromatic polyamide.

Examples of the polymer further include: carbonate polymer; vinyl chloride polymer; imide polymer; sulfone polymer; polyether-sulfone; polyether-ether-ketone; polyphenylene sulfide; vinyl alcohol polymer; vinylidene chloride polymer; vinyl butyral polymer; arylate polymer; polyoxymethylene; silicone polymer; urethane polymer; ether polymer; vinyl acetate polymer; blends of these polymers; and heat-curable or ultraviolet-curable polymer such as phenol polymer, melamine polymer, acrylic polymer, urethane polymer, urethane acrylic polymer, epoxy polymer or silicone polymer.

Examples of the liquid crystal material include: low-molecular liquid crystal or crosslinkable liquid crystal monomers exhibiting a nematic or smectic phase at room temperature or at a high temperature; and liquid crystal polymers exhibiting a nematic or smectic phase at room temperature or at a high temperature. Specific examples of the liquid crystal material include a cyanobiphenyl compound, a cyanophenylcyclohexane compound, a cyanophenyl ester compound, a phenyl benzonate ester compound, a phenylpyrimidine compound, and mixtures of these compounds.

The crosslinkable liquid crystal monomer is generally crosslinked into a polymer by a suitable method using heat, light or the like after the orienting process.

To obtain the anisotropic scattering resin layer 7 excellent in heat resistance, durability, etc., the crosslinkable liquid crystal monomer or liquid crystal polymer may be preferably combined with a polymer having a glass transition temperature of not lower than 50° C., especially not lower than 80° C., further especially not lower than 120° C.

The kind of the liquid crystal polymer is not particularly limited. Any suitable polymer such as a main-chain polymer or a side-chain polymer may be used as the liquid crystal polymer. From the point of view of the formability and thermal stability of micro domains excellent in uniformity in particle size distribution, the moldability into a film, the facilitation of the orienting process, and so on, the degree of polymerization of the preferably used liquid crystal polymer is not lower than 8, especially not lower than 10, further especially in a range of from 15 to 5000.

For example, the anisotropic scattering resin layer 7 can be formed from the liquid crystal polymer by the following method. That is, at least one kind of polymer is mixed with at least one kind of liquid crystal polymer for forming micro domains to thereby form a polymer film containing the liquid crystal polymer dispersed in the form of micro domains. The polymer film is oriented by a suitable method to thereby form regions different in birefringence characteristic.

From the point of view of controllability of the refractive index differences $\Delta n_1$ and $\Delta n_2$ in the orienting process, a liquid crystal polymer having a glass transition temperature of not lower than 50° C. and exhibiting a nematic liquid crystal phase in a temperature range lower than the glass transition temperature of a polymer combined with the liquid crystal polymer is used preferably.

Specifically, a side-chain liquid crystal polymer having a monomer unit represented by the following general formula (A) is used.

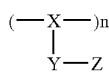
(A)

A suitable thermoplastic polymer such as a homopolymer or a copolymer having a monomer unit represented by the general formula (A) maybe used as the side-chain liquid crystal polymer. A polymer excellent in monodomain orienting characteristic is preferred.

In the general formula (A), X is a skeleton group which forms a main chain of the liquid crystal polymer and which may be constituted by a suitable linkage chain such as a linear chain, a branched chain or a cyclic chain. Specific examples of X include polyacrylate, polymethacrylate, poly-α-haloacrytlate, poly-α-cyanoacrylate, polyacrylamide, polyacrylonitrile, polymethacrylonitrile, polyamide, polyester, polyurethane, polyether, polyimide, and polysiloxane.

In the general formula (A), Y is a spacer group branched from the main chain. Examples of Y preferred from the point of view of the formability of the polarizing/scattering site such as refractive index controllability include ethylene, propylene, butylene, pentylene, hexylene, octylene, decylene, undecylene, dodecylene, octadecylene, ethoxyethylene, and methoxybutylene. In the general formula (A), Z is a mesogen group which gives liquid crystal orienting characteristic.

For example, the anisotropic scattering resin layer can be formed from the nematic liquid crystal polymer by the following method. That is, a polymer for forming a polymer film is mixed with a liquid crystal polymer which exhibits a nematic liquid crystal phase in a temperature range lower than the glass transition temperature of the polymer and which has a glass transition temperature of not lower than 50° C., especially not lower than 60° C., further especially not lower than 70° C. Thus, a polymer film containing the liquid crystal polymer dispersed in the form of micro domains is formed. The liquid crystal polymer which forms the micro domains is heated so as to be oriented in the form of a nematic liquid crystal phase. Then, the liquid crystal polymer is cooled to fix the oriented state of the liquid crystal polymer.

The polymer film containing the micro domains dispersed, that is, the film to be oriented, can be produced by a suitable method such as a casting method, an extrusion molding method, an injection molding method, a roll molding method or a flow-out molding method. Alternatively, the film can be also produced by a method in which a monomer-state material is expanded and polymerized by a heating process or by a process of radiation such as ultraviolet rays to thereby form a film.

From the point of view of obtaining the anisotropic scattering resin layer excellent in uniform distribution of the micro domains, there may be preferably used a technique in which a mixture solution containing forming materials dissolved in a solvent is used for forming a film by a casting method, a flow-out molding method or the like. In this case, the size of each micro domain and the distribution of the micro domains can be suitably controlled on the basis of the kind of the solvent, the viscosity of the mixture solution, the drying speed of the expended layer of the mixture solution, and so on. Incidentally, reduction in viscosity of the mixture solution and increase in drying speed of the expended layer of the mixture solution is effective in reducing the area of each micro domain.

The thickness of the film to be oriented can be decided suitably. From the point of view of the facilitation of the orienting process, the thickness is generally selected to be in a range of from 1 μm to 3 mm, especially in a range of 5 μm to 1 mm, further especially in a range of from 10 μm to 500 μm. At the time of formation of the film, suitable additives such as a dispersing agent, a surface active agent, a color tone adjusting agent, a flame retarding agent, a releasing agent and an anti-oxidizing agent may be mixed.

The orienting process can be carried out by use of at least one method selected from various methods in which the refractive index can be controlled on the basis of orientation. Examples of the various methods include: a stretching or calendering method using uniaxial or biaxial treatment, sequential biaxial treatment or Z axial treatment; a method of fixing orientation by cooling the film rapidly after applying an electric or magnetic field to the film at a temperature of not lower than the glass or liquid crystal transition temperature; a method of fluid-orienting liquid crystal at the time of formation of the film; and a method of self-orienting liquid crystal on the basis of slight orientation of an isotropic polymer. Therefore, the anisotropic scattering resin layer 7 obtained may be a stretched film or may be a non-stretched film.

Incidentally, when the anisotropic scattering resin layer 7 is a stretched film, a brittle polymer can be used but a polymer excellent in stretchability may be used preferably.

When the micro domains are made of a liquid crystal polymer, the orienting process can be carried out, for example, by a method in which: a polymer film is heated and melted at a temperature at which a liquid crystal polymer dispersed/distributed as micro domains in the polymer film exhibits an aimed liquid crystal phase such as a nematic phase; the liquid crystal polymer is oriented under the action of orientation limiting force; and the polymer film is cooled rapidly to fix the oriented state. It is preferable from the point of view of preventing variation in optical characteristic that the oriented state of the micro domains satisfies a monoodomain state as sufficiently as possible.

Incidentally, as the orientation limiting force, there can be used a suitable limiting force by which the liquid crystal polymer can be oriented, such as stretching force due to a technique of stretching the polymer film at a suitable magnification or shearing force or electric or magnetic field at the time of formation of the film. The liquid crystal polymer can be oriented by the action of at least one kind of limiting force selected from these kinds of limiting force.

Therefore, the other portions than the micro domains in the anisotropic scattering resin layer may exhibit birefringence or may be isotropic.

An anisotropic scattering resin layer exhibiting birefringence as a whole can be obtained by molecular alignment or the like in the film-forming process using an oriented birefringent polymer as the polymer for forming a film. If necessary, known orienting means such as a stretching process can be used for giving or controlling birefringence.

An anisotropic scattering resin layer in which the other portions than the micro domains are isotropic can be obtained, for example, by a method in which: an isotropic polymer is used as the polymer for forming a film; and the film is stretched in a temperature range not higher than the glass transition temperature of the polymer.

Preferably, in the invention, refractive index differences $\Delta n_1$, $\Delta n_2$ and $\Delta n_3$ between the micro domains and the other portions, that is, between the micro domains and the portions made of the light-transmissive resin in respective optically axial directions of the micro domains are controlled so that $\Delta n_1$ in an axial direction ($\Delta n_1$ direction) where the refractive index differences are maximized is in a range of from 0.03 to 0.5, and that each of $\Delta n_2$ and $\Delta n_3$ in two axial directions ($\Delta n_2$ direction and $\Delta n_3$ direction) perpendicular to the $\Delta n_1$ direction is not smaller than 0.03. More preferably, controlling is performed so that $\Delta n_2$ and $\Delta n_3$ are equal to each other.

When the refractive index differences are controlled in this manner, linearly polarized light in the $\Delta n_1$ direction is scattered intensely so that the amount of light scattered at an angle smaller than the critical angle and emerging from the anisotropic scattering resin layer can be increased, but linearly polarized light in the other directions is hardly scattered so that the light can be confined in the inside of the anisotropic scattering resin layer while total reflection is repeated.

Incidentally, when the light-transmissive resin is optically isotropic, the refractive index difference between the micro domains and the other portions in each optically axial direction of the micro domains means the difference between the refractive index of the micro domains in each optically axial direction and the average refractive index of the light-transmissive resin. When the light-transmissive resin is optically anisotropic, the refractive index difference means the refractive index difference in refractive index in each axial direction because the main optically axial direction of the light-transmissive resin generally coincides with the main optically axial direction of the micro domains.

In the invention, it is preferable from the point of view of the total reflection that the refractive index difference $\Delta n_1$ in the $\Delta n_1$ direction is moderately large. The refractive index difference $\Delta n_1$ is selected to be especially in a range of from 0.035 to 0.5, further especially in a range of from 0.040 to 0.45. On the other hand, it is preferable that the refractive index differences $\Delta n_2$ and $\Delta n_3$ in the $\Delta n_2$ and $\Delta n_3$ directions are as small as possible. That is, it is preferable that the refractive index differences $\Delta n_2$ and $\Delta n_3$ are as near to zero as possible. These refractive index differences can be controlled on the basis of the refractive indices of the materials used, the aforementioned orienting operation, and so on.

Preferably, the $\Delta n_1$ direction is parallel to two opposite surfaces of the anisotropic scattering resin layer because the $\Delta n_1$ direction forms a plane of vibration of linearly polarized light output from the anisotropic scattering resin layer. Incidentally, the $\Delta n_1$ direction in a plane can be selected as a suitable direction according to an aimed liquid crystal cell etc.

It is preferable from the point of view of uniformity of the scattering effect that the micro domains are dispersed/distributed in the anisotropic scattering resin layer as evenly as possible. The size of each micro domain, especially the length in the $\Delta n_1$ direction as a scattering direction, has relation with backward scattering (reflection) and wavelength dependency. From the point of view of improvement in light utilization efficiency, prevention of coloring due to wavelength dependency, prevention of visibility inhibition or sharp display inhibition due to the sight of the micro domains, film formability, film strength, etc., the preferred size of each micro domain, especially the preferred length in the $\Delta n_1$ direction, is in a range of from 0.05 μm to 500 μm, especially in a range of from 0.1 μm to 250 μm, further especially in a range of from 1 μm to 100 μm. Incidentally, each micro domain generally exists in a domain state in the anisotropic scattering resin layer. The length of each micro domain in the $\Delta n_2$ direction or the like is not particularly limited.

The percentage of the micro domains in the anisotropic scattering resin layer 7 can be decided suitably according to the scattering characteristic in the $\Delta n_1$ direction. Generally, from the point of view of film strength, the percentage of the micro domains is preferably selected to be in a range of from 0.1% by weight to 70% by weight, especially in a range of from 0.5% by weight to 50% by weight, further especially in a range of from 1% by weight to 30% by weight.

In the invention, the anisotropic scattering resin layer 7 may be formed as a single layer or may be formed as a laminate of two or more layers. When the anisotropic scattering resin layer 7 is formed as a laminate, a synergistic scattering effect higher than that proportional to increase in thickness can be obtained. It is preferable from the point of view of increase in scattering effect that the laminate is formed so that $\Delta n_1$ directions in upper and lower layers are parallel to each other. The number of layers to be laminated can be set at a suitable value of 2 or greater.

In the anisotropic scattering resin layer 7, the layers to be laminated may be equalized in $\Delta n_1$, $\Delta n_2$, etc. or may be differentiated in $\Delta n_1$, $\Delta n_2$, etc.

Although it is preferable that $\Delta n_1$ directions or the like in upper and lower layers are as parallel to each other as possible, variation caused by work error may be permitted. When the $\Delta n_1$ direction varies, the average direction is regarded as the $\Delta n_1$ direction.

Because the polarized state of light needs to be eliminated suitably in the process in which the light is propagated through the anisotropic scattering resin layer 7, it is preferable that the anisotropic scattering resin layer 7 has a phase difference on the whole or part of the planar light source. Basically, because the phase axis of the anisotropic scattering resin layer and the axis of polarization (plane of vibration) of linearly polarized light hardly scattered are perpendicular to each other, conversion of polarized light caused by the phase difference hardly occurs. It is however conceived that conversion of polarized light occurs because the apparent angle is changed by slight scattering.

Although the in-plane phase difference varies according to the thickness of the anisotropic scattering resin layer, it is generally preferable from the point of view of conversion of polarized light that the in-plane phase difference is not smaller than 5 nm. The phase difference can be given by a suitable method such as a method using bireferingent fine particles to be contained in the anisotropic scattering resin layer, a method using bireferingent fine particles to be deposited on a surface of the anisotropic scattering resin layer, a method using a light-transmissive resin having birefringence, a method using these methods in combination, and a method of integrally laminating birefringent films.

In the invention, the luminescent material 80 may be contained in the inside of the anisotropic scattering resin layer 7 provided on the support substrate 1 as shown in FIG. 5 so that the resin layer 7 can serve as an anisotropic scattering color conversion layer. In this embodiment, the luminescent material 80 may be contained either in the light-transmissive resin of the anisotropic scattering resin layer 7 or in the micro domains 70 or may be contained both in the light-transmissive resin and in the micro domains 70. In any case, it is preferable that the luminescent material 80 is evenly dissolved or dispersed in the resin layer 7. Because scattering due to the luminescent material is undesirable, a material dissolved in the resin layer 7 is particularly preferably used as the luminescent material 80. When a material dispersed in the resin layer 7 is used as the luminescent material 80, the size of dispersion is selected to be as small as possible in order to suppress unnecessary scattering.

The luminescent material can be dissolved or dispersed by a suitable method such as a method in which the luminescent material mixed with other additives if necessary is contained in the light-transmissive resin or the micro domain-forming material before the cell is formed.

The luminescent material 80 need not be contained in the anisotropic scattering resin layer 7, that is, may be contained in another layer than the anisotropic scattering resin layer 7. It is important that the layer containing the luminescent material 80 is located between the anisotropic scattering resin layer 7 and the emitting layer. If the luminescent material-containing layer is formed on the observer side viewed from the anisotropic scattering resin layer 7, the effect of the invention cannot be obtained because excitation light is only scattered so that total reflection occurs in the air layer surface and because light generated from the excited luminescent material is only natural light even in the case where excitation light is polarized light.

Figure 6:
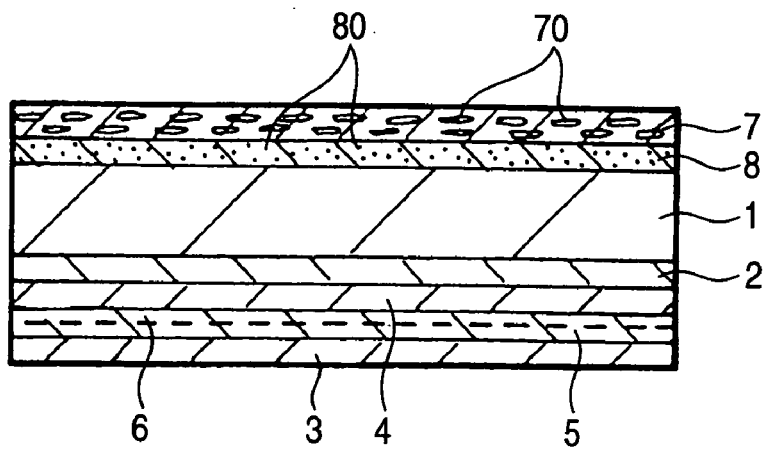
FIG. 6 is a sectional view showing a still further example of the organic electroluminescence device according to the invention.
Figure 7:
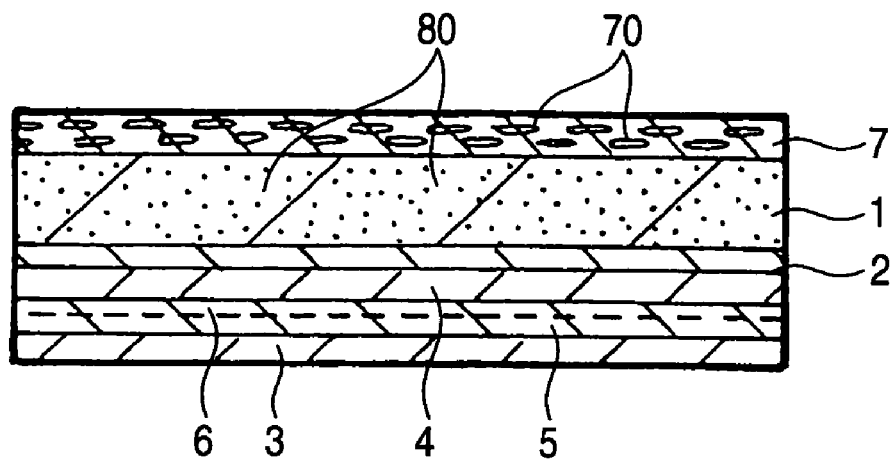
FIG. 7 is a sectional view showing a still further example of the organic electroluminescence device according to the invention.
Figure 8:
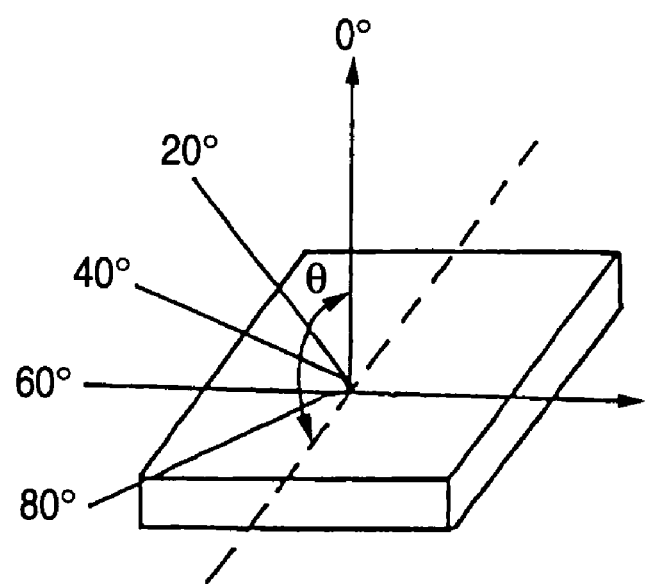
FIG. 8 is a view for explaining the characteristic of the organic electroluminescence device obtained in Example 1.

FIGS. 6 and 7 show the aforementioned example. FIG. 6 shows the case where a simple color conversion layer 8 which contains the luminescent material 80 but has no anisotropic scattering characteristic is provided between the support substrate land the anisotropic scattering resin layer 7. FIG. 6 shows the case where the support substrate 1 containing the luminescent material 80 serves also as a color conversion layer. In FIGS. 6 and 7, other parts are the same as those shown in FIG. 5 and referred to by numerals the same as those in FIG. 1 for the sake of omission of duplicated description.

In the configuration shown in FIG. 6, the luminescent material 80 contained in the color conversion layer 8 generates fluorescence or phosphorescence when excited by light emitted from the emitting layer. The fluorescence or phosphorescence is made incident on the anisotropic scattering resin layer 7 as it is. Accordingly, there is no light loss due to total reflection, so that the effect of the invention can be obtained sufficiently. In the configuration shown in FIG. 7, the luminescent material 80 contained in the support substrate 1 serving as the color conversion layer generates fluorescence or phosphorescence in the same manner as described above. The fluorescence or phosphorescence is made incident on the anisotropic scattering resin layer 7 as it is. Accordingly, the effect of the invention can be obtained sufficiently in the same manner as described above.

Incidentally, when the luminescent material 80 needs to be contained in the color conversion layer 8 having no anisotropic scattering characteristic, it is preferable that the luminescent material 80 is evenly dissolved or dispersed in the color conversion layer 8 in the same manner as in the case where the anisotropic scattering color conversion layer is formed.

If necessary, one luminescent material may be contained both in the inside of the anisotropic scattering resin layer 7 and in any place between the anisotropic scattering resin layer 7 and the emitting layer or different luminescent materials may be contained in the two places respectively. Further, layers containing different luminescent materials respectively may be laminated. That is, the form for providing the luminescent material can be selected at option. For example, films each containing a transparent resin and a luminescent material dispersed in the transparent resin may be stuck onto one another to form a laminated structure. For example, luminescent materials dissolved in solvents respectively may be applied to form a laminated structure. These respective layers may be laminated directly or bonded to one another through a transparent pressure-sensitive adhesive or adhesive agent. Further, each luminescent material may be contained in the pressure-sensitive adhesive or adhesive agent.

In the invention, the luminescent material is not particularly limited if it is a material which can absorb ultraviolet rays or visible light rays and generate light with a wavelength in a visible light wavelength range. An organic dye, an inorganic pigment or the like which can radiate fluorescence as light generated from an excitation singlet state or phosphorescence as light generated from an excitation triplet state can be used as the luminescent material. Materials exhibiting blue, green and red as wavelengths of light may be preferably used singly or in combination. Examples of the organic fluorescent dye include a blue fluorescent substance, a green fluorescent substance, and a red fluorescent substance as follows.

The blue fluorescent substance is not particularly limited if it is an organic compound exhibiting a peak wavelength of fluorescence of not smaller than 380 nm and smaller than 480 nm in a solution state. It is preferable that at least one member selected from the group consisting of stilbene derivatives, distyryl arylene derivatives, and tristyryl arylene derivatives is contained as the blue fluorescent substance. Other examples of the blue fluorescent substance include: polycyclic aromatic compounds such as anthracene, berylline, and coronene; and alkyl substitutes thereof.

The green fluorescent substance is not particularly limited if it is an organic compound exhibiting a peak wavelength of fluorescence of not smaller than 480 nm and smaller than 580 nm in a solution state. Specific examples of the green fluorescent substance include: coumarin compounds such as 3-(2'-benzimidazolyl)-7-N,N-diethylaminocoumarin (coumarin-535), 3-(2-benzothiazolyl)-7-diethylaminocoumarin (coumarin-540), 2,3,5,6-1H,4H-tetrahydro-8-trifluoromethylquinolizino-<9,9 a,1-gh>coumarin (coumarin-540A), 3-(5-chloro-2-benzothiazolyl)-7-diethylaminocoumarin (coumarin-34), 4-trifluoromethyl-piperidino[3,2-g]coumarin (coumarin-340), N-ethyl-4-trifluoromethyl-piperidino[3,2-g]coumarin (coumarin-355), N-methyl-4-trifluoromethyl-piperidino[2,3-h]coumarin, and 9-cyano-1,2,4,5-3H,6H,10H-tetrahydro-1-benzopyrano[9,9a1-g h]quinolizine-10-one (coumarin-377); xanthine pigments such as 2,7-dichlorofluorescein; tetracene; and quinacridone compounds.

The red fluorescent substance is not particularly limited if it is an organic compound exhibiting a peak wavelength of fluorescence of not smaller than 580 nm and not larger than 650 nm in a solution state. Specific examples of the red fluorescent substance include dicyanomethylene pyran derivatives, dicyanomethylene thiopyran derivatives, fluorescein derivatives and perylene derivatives used as red oscillation laser pigments described in European Patent Laid-Open No. 281381.

Materials excellent in fastness properties may be preferably used as these luminescent materials if consideration is given to lowering of luminous efficiency under the process or environment used when the anisotropic scattering color conversion layer or the simple color conversion layer is formed. The amount of the luminescent material used may be selected to be in a range of from 0.1% by mole to 10%by mole, preferably in a range of from 0.5% by mole to 5% by mole with respect to the resin material for forming the color conversion layer. This amount is a concentration range to prevent concentration extinction.

Incidentally, all excitation light emitted from the organic EL cell need not be absorbed to the luminescent material. That is, the luminescent material may absorb part of light so that the color of part of the light is converted into a color of a long wavelength but the other part of the excitation light source not absorbed is extracted to the outside as it is. When, for example, a proper amount of an organic dye capable of generating yellow light is added or proper amounts of organic dyes capable of generating green light and red light respectively are added in the condition that excitation light of blue is used, white light can be obtained finally. These amounts may be adjusted suitably in accordance with the emission spectrum of excitation light and the absorption spectrum and infrared spectrum of each organic dye in order to obtain the aimed color of light.

The basic configuration of the organic EL cell according to the invention, that is, the organic material, the electrode material, the layer configuration, the thickness of each layer and so on are not particularly limited. For example, the background art can be applied to the basic configuration as it is. The organic layer is not particularly limited. For example, the organic layer may be formed by means of depositing vacuum vapor of a low molecular material or by means of applying a high molecular material.

Besides the two-layer type organic EL cell having an anode, a hole transport layer, an electron transport emitting layer and a cathode, a three-layer type organic EL cell having an anode, a hole transport layer, an emitting layer, an electron transport layer and a cathode or any other type cell than these laminated cells, such as a cell having an anode, an emitting layer and a cathode, can be selected as a specific configuration without any particular limitation.

A hole injection layer may be provided on an anode surface or an electron injection layer may be provided on a cathode surface. An electron block layer or a hole block layer may be inserted in order to improve recombination efficiency. Basically, when the configuration, the materials and the forming method are selected so that luminous efficiency can be improved, intensive EL emission can be obtained in spite of low power consumption so that the luminescent material in the color conversion layer can be excited to generate light efficiently in order to improve the effect of the invention more greatly.

Of course, materials for the emitting layer can be selected in such a way that the light emitted from the emitting layer functions as excitation light of the luminescent material. Ultraviolet or blue-light luminescent materials are basically used but can be selected optional in consideration of the characteristics between the excitation light and the luminescent material.

Optimal materials can be selected suitably as the electrode materials. In the general organic EL cell, a transparent electrically conductive film made of a material such as indium tin oxide (ITO) or tin oxide is used as the anode whereas an electrode obtained by co-deposition of Mg and Ag vapors at an atomic ratio of about 10:1, an electrode of Ca, an electrode of Al doped with a small amount of Li, or the like, is applied to the cathode from the point of view of improvement in electron injection efficiency due to reduction in work function of the cathode. There is however no particular limit to the electrode materials.

In the invention, a general substrate can be used as the support substrate regardless of whether the substrate is transparent or not. A glass substrate may be used as the support substrate so that generated light can be extracted to the glass substrate side through the transparent electrode. Alternatively, an opaque metal plate may be used as the support substrate so that generated light can be extracted from a side opposite to the substrate. Alternatively, the opaque metal plate may be used as the support substrate so that the anisotropic scattering resin layer can be formed on the transparent electrode.

Besides the provision of the anode as a transparent electrode, the cathode may be also provided as a transparent electrode in such a manner that a metal electrode is formed, for example, as a cathode having a thickness of from the order of nm to the order of tens of nm from the organic layer surface to retain light transmissivity and ITO or the like is then formed on the metal electrode. It is a matter of course that a flexible material such as a polymer film may be used as the substrate or that the region for disturbing the angle of reflection/refraction of light may be formed in the substrate per se. As described above, the luminescent material may be dispersed in the substrate. Further, the anisotropic scattering resin layer may be also formed between the support substrate and the transparent electrode. In the invention, even in the case where the support substrate is located on the anisotropic scattering resin layer, the effect of the invention can be also obtained.

A high-molecular film can be also used as the support substrate. Specific examples of the material of the high-molecular film include polyethylene terephthalate, triacetyl cellulose, polyethylene naphthalate, polyether-sulfone, polycarbonate, polyacrylate, polyether-ether-ketone, and norbornene resin.

When the support substrate is located on the light-extracting surface side viewed from the anisotropic scattering resin layer, a material having no optical anisotropy, that is, exhibiting no birefringence needs to be selected as the material of the support substrate in order to retain linearly polarized light generated by the anisotropic scattering resin layer.

If the support substrate exhibits birefringence, linearly polarized light output from the anisotropic scattering resin layer is converted into elliptically polarized light in accordance with the relation of the optical axis and phase difference in the linearly polarized light. As a result, when the organic EL cell is applied to a liquid crystal display device or the like, there is the possibility that the amount of a light component absorbed to a polarizing plate in the liquid crystal display device may increase. It is therefore necessary that a commercially available substrate having no optical anisotropy, such as a glass substrate, an epoxy resin substrate, a triacetyl cellulose film or a norbornene resin film, is used as the support substrate in this case.

Although FIGS. 1, 3, 4, 5, 6 and 7 show the case where the region for disturbing the angle of reflection/refraction of light, the anisotropic scattering resin layer, or the color conversion layer is directly formed on the support substrate or the transparent electrode, the anisotropic scattering resin layer or the color conversion layer may be bonded to the support substrate or the transparent electrode through a transparent pressure-sensitive adhesive or adhesive agent. In this case, refractive indices of these pressure-sensitive adhesive and adhesive agents are preferably adjusted while consideration is given to the refractive indices of the respective layers in order to prevent light generated by the organic EL cell from being lost due to total reflection as sufficiently as possible.

When, for example, the light-scattering color conversion layer made of the region 7 for disturbing the angle of reflection/refraction of light and the luminescent material 8 contained in the region 7 (anisotropic scattering color conversion layer made of the anisotropic scattering resin layer 7 containing the luminescent material 80: FIG. 5) needs to be bonded onto the support substrate (glass substrate) 1 through a pressure-sensitive adhesive agent as shown in FIG. 1, the refractive index of the pressure-sensitive adhesive agent is preferably selected to be higher than the refractive index of the glass substrate and lower than the refractive index of the light-scattering color conversion layer (anisotropic scattering resin layer). As a result, excitation light can be made incident on the anisotropic scattering resin layer efficiently because total reflection does not occur in the interfaces between the glass substrate and the pressure-sensitive adhesive agent and between the pressure-sensitive adhesive agent and the light-scattering color conversion layer (anisotropic scattering resin layer). Incidentally, the refractive index of the pressure-sensitive adhesive agent need not always satisfy the aforementioned relation. That is, if the refractive index difference is not larger than about 0.1, there is no fear that the effect of the invention will be reduced remarkably.

In the organic EL cell according to the invention, a lens sheet or light-diffusing plate having polarization retaining characteristic, a wavelength cut filter, a phase retarder film, etc. can be used suitably as the light-extracting surface. The lens sheet controls the optical path of output light (linearly polarized light) while keeping the degree of polarization of the light as constant as possible to improve frontal directivity advantageous to visibility to thereby direct the peak of intensity of scattered output light to the frontal direction.

The wavelength cut filter is used for the purpose of preventing light directly generated by an excitation light source from advancing straight, for example, to a liquid crystal display device. Particularly when excitation light is ultraviolet rays, it is necessary to prevent the liquid crystal and polarizing plate from being deteriorated by the ultraviolet rays. The wavelength cut filter maybe also used for the purpose of removing visible light rays with unnecessary wavelengths.

In the invention, if necessary, an ultraviolet-absorbing agent or the like may be mixed with the anisotropic scattering resin layer or other constituent members without provision of the wavelength cut filter so that a wavelength cut function can be given to the anisotropic scattering resin layer or other constituent members.

The invention can further provide a (polarizing-type) planar light source having the organic EL cell as a light-emitting element with the same configuration as described above. The invention can further provide a display device having the organic EL cell as a light-emitting element. Accordingly, a (polarizing-type) planar light source and a display device high in luminous efficiency can be provided.

The invention will be described specifically in the following Examples but is not limited to the following Examples.

<Production of Basic Structure of Organic EL Cell>

A 100 nm-thick ITO film was formed from an ITO ceramic target ($In_2O_3$:$SnO_2$=90% by weight:10% by weight) on a surface of a glass substrate by a DC sputtering method to thereby form a transparent electrode (anode).

Then, in the condition that a photo resist was used, ITO was etched to form a pattern having a luminous area of 15 mm×15 mm. After ultrasonic cleaning, ozone cleaning was performed by using a low-pressure ultraviolet lamp.

Then, in order to use blue light as excitation light, organic layers were formed successively on the ITO surface by a vacuum vapor deposition method with reference to a method described in the paper [Junji Kido et al., Jpn. J. Appl. Phys., Vol. 32, Part. 2, No. 7A, L917–L920 (1993)].

First, CuPc represented by the formula (3) was deposited at a vapor deposition rate of 0.3 nm/s to form a 15 nm-thick hole injection layer. Next, TPD represented by the formula (4) was deposited at a vapor deposition rate of 0.3 nm/s to form a 40 nm-thick hole transport blue emitting layer. Next, TAZ represented by the formula (5) was deposited at a vapor deposition rate of 0.3 nm/s to form a 15 nm-thick hole block layer. Finally, Alq represented by the formula (6) was deposited at a vapor deposition rate of 0.3 nm/s to form a 90 nm-thick electron transport layer.

Then, Mg and Ag were co-deposited at a vapor deposition rate of 1 nm/s and at a vapor deposition rate of 0.1 nm/s respectively to form a 100 nm-thick MgAg layer. From the point of view of inhibiting oxidation of the MgAg layer, a 50 nm-thick Ag layer was further formed on the MgAg layer to thereby form a reflective electrode (cathode).

The resulting cell was extracted from the vacuum vapor deposition apparatus. Then, an ultraviolet-curable epoxy resin was dripped onto the cathode side. Slide glass was put on the epoxy resin. At a point of time when the epoxy resin was spread sufficiently, the epoxy resin was cured by a high-pressure ultraviolet lamp to seal the cell.

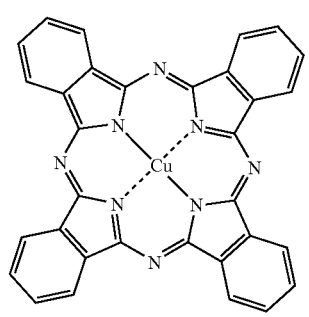

(3)

-continued

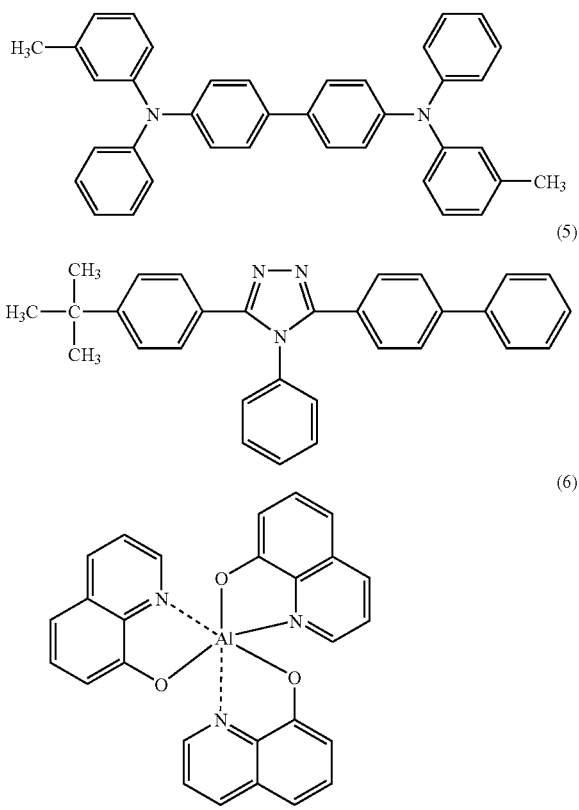

A DC voltage of 13 V was applied to the organic EL cell produced in the aforementioned manner before a region for disturbing an angle of reflection/refraction or an anisotropic scattering resin layer (light-scattering color conversion layer or anisotropic scattering color conversion layer) was formed. As a result, current conduction with a current density of 13.5 mA/cm$^2$ occurred in the cell, so that generation of light was observed. The color of the generated light was bluish white. The guided light component confined in the cell viewed from a side of the glass substrate was very intensive blue.

As shown in FIG. 5, the luminance of the cell in the θ direction was measured at intervals of 10 degrees in a range of from 0 degrees to 80 degrees by use of a luminance meter (trade name "BM-9" made by Topcon Corp.) available on the market. The angular distribution of luminance was examined while standardization was made so that the luminance at an angle of 0 degrees from the frontal direction was regarded as 1.

Results were shown as follows: 1.00 at 0 degrees, 1.03 at 10 degrees, 1.06 at 20 degrees, 1.12 at 30 degrees, 1.15 at 40 degrees, 1.18 at 50 degrees, 1.21 at 60 degrees, 1.21 at 70 degrees, and 1.15 at 80 degrees.

It was obvious from these results that the organic EL cell satisfied the expression (1) of the invention sufficiently. In the cell, hole-electron recombination substantially occurred on the TPD side of the interface between TAZ and TPD. Accordingly, the distance d between the central portion of the hole-electron recombination emitting region and the reflective electrode in the invention was about 105 nm.

The peak wavelength λ of the emission spectrum of the TPD thin film vapor-deposited on the glass substrate was about 450 nm. The refractive index n of the TPD thin film measured with a spectral ellipsometer was about 1.68. Accordingly, the organic EL cell also satisfied the expression (2) of the invention.

EXAMPLE 1

<Formation of Light-Scattering Color Conversion Layer (Layer made of Reflection/Refraction Angle Disturbance Region Containing Luminescent Material)>

In dichloromethane, 0.2% by weight of "Lumogen F Yellow-083" as a green fluorescent dye made by BASF Corp. was dissolved to prepare a solution. On the other hand, 0.15% by weight of "Lumogen F Red-305" as a red fluorescent dye made by BASF Corp. was dissolved in dichloromethane to prepare a solution. These solutions of the same quantity of 10 g were mixed with each other to prepare a mixture solution. Into the mixture solution, 6.5 g of methyl polymethacrylate as a matrix resin and 1.3 g of alumina fine particles as diffusing particles ("UA-5035" made by Showa Denko K. K., mean particle size: 0.9 μm) were added and stirred sufficiently.

The resulting solution was cast on a 50 μm-thick separator of a polyethylene terephthalate film treated with a releasant by an applicator and dried sufficiently. Then, the cast film was separated from the separator. Thus, a 55 μm-thick light-scattering color conversion layer was obtained.

Figure 9:
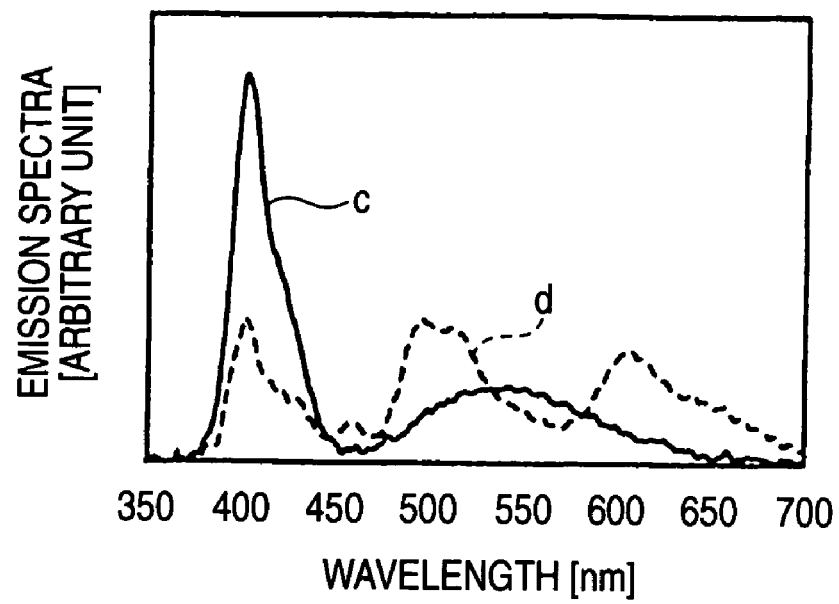
FIG. 9 shows emission spectra before and after the formation of the light-scattering color conversion layer according to Example 1.

Then, the light-scattering color conversion layer was bonded onto the surface of the glass substrate of the organic EL cell produced in the aforementioned manner through an acrylic transparent pressure-sensitive adhesive agent to produce an aimed organic EL cell. A voltage of 13 V was applied to the cell so that current conduction with a current density of 13.5 mA/cm$^2$ occurred in the cell in the same manner as described above. As a result, white light was generated. FIG. 9 shows emission spectra before and after the formation of the light-scattering color conversion layer. In FIG. 9, the curve c shows the emission spectrum before the formation of the light-scattering color conversion layer, and the curve d shows the emission spectrum after the formation of the light-scattering color conversion layer.

EXAMPLE 2

<Formation of Anisotropic Scattering Color Conversion Layer (Anisotropic Scattering Resin Layer Containing Luminescent Material)>

In dichloromethane, 950 parts by weight of norbornene resin ("ARTON" made by JSR Corp., glass transition temperature: 182° C.), 50 parts by weight of liquid crystal polymer (glass transition temperature: 80° C., nematic liquid crystal transition temperature: 100° C. to 290° C.) represented by the formula (7) and 5 parts by weight of a 1.4:1 mixture of "Lumogen F Yellow-083" as a green fluorescent dye made by BASF Corp. and "Lumogen F Red-305" as a red fluorescent dye made by BASF Corp. were dissolved to prepare a solution containing 20% by weight of dichloromethane. A 100 μm-thick film was formed from this solution by a casting method. The film was stretched at 180° C. to three times and then cooled rapidly to obtain an anisotropic scattering color conversion layer in the form of a film.

[Chemical Formula 2]

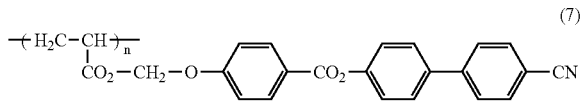

(7)

The anisotropic scattering color conversion layer was provided so that a liquid crystal polymer was dispersed in a transparent film of a norbornene resin while it was formed as domains having long axes in the stretching direction and substantially equal in shape. The anisotropic scattering color conversion layer exhibits a refractive index difference $\Delta n_1$ of 0.23 and refractive index differences $\Delta n_2$ and $\Delta n_3$ of 0.029. The average diameter of the micro domains was measured by examination of coloring based on the phase difference under a polarizing microscope. As a result, the length in the $\Delta n_1$ direction was about 5 μm.

Then, two anisotropic scattering color conversion layers produced in the aforementioned manner were bonded onto the glass substrate of the organic EL cell having the basic configuration produced in the aforementioned manner, through an acrylic pressure-sensitive adhesive agent. A voltage of 13 V was applied to the organic EL cell in the same manner as described above. As a result, current conduction with a current density of 13.5 mA/cm² occurred and white light was generated from the organic EL cell.

COMPARATIVE EXAMPLE 1

An organic EL cell as a basic configuration and an organic EL cell obtained by forming a light-scattering color conversion layer or an anisotropic scattering color conversion layer on the basic configuration were produced in the same manner as in Example 1 or 2 except that Alq represented by the formula (6) was formed as an electron transport layer to have a thickness of 45 nm.

A voltage of 8.3 V was applied to the organic EL cell before and after the formation of the light-scattering color conversion layer or the anisotropic scattering color conversion layer so that current conduction with a current density of 10.5 mA/cm² occurred in the cell to make the cell generate light. In this condition, the cell was evaluated by the same method as used in Example 1.

In the organic EL cell before the formation of the light-scattering color conversion layer or the anisotropic scattering color conversion layer, the color of generated light and the color of guided light were both blue. The intensity of the guided light component was weak compared with Example 1 or 2. The distribution of luminance in the θ direction was as follows: 1.00 at 0 degrees, 1.00 at 10 degrees, 0.93 at 20 degrees, 0.93 at 30 degrees, 0.89 at 40 degrees, 0.89 at 50 degrees, 0.79 at 60 degrees, 0.79 at 70 degrees, and 0.71 at 80 degrees.

It was obvious from these results that the distribution of luminance in the θ direction before the formation of the anisotropic scattering color conversion layer did not satisfy the expression (1) of the invention. The total thickness of the Alq layer and the TAZ layer was 60 nm and did not satisfy the expression (2) of the invention, either.

Figure 10:
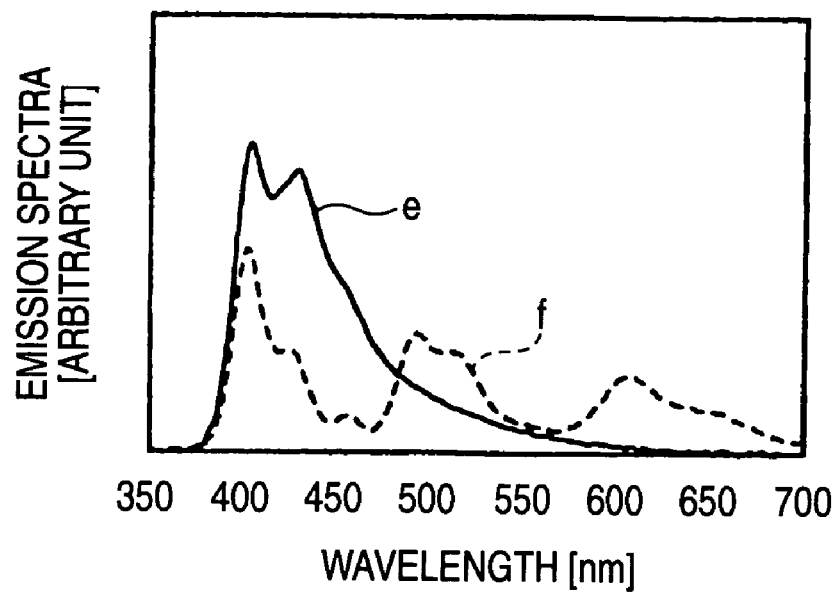
FIG. 10 shows emission spectra before and after the formation of the light-scattering color conversion layer according to Comparative Example 1.
Figure 11:
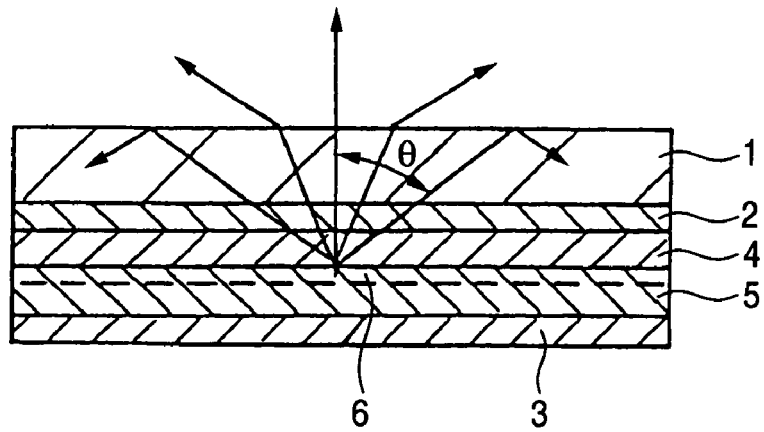
FIG. 11 is a view for explaining the principle of the organic electroluminescence device according to the invention.
Figure 12:
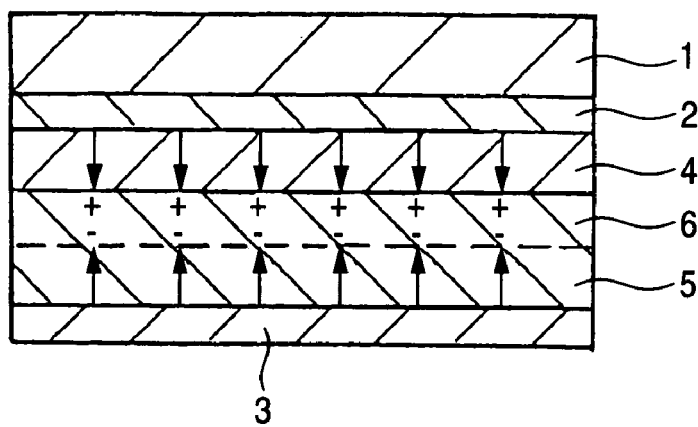
FIG. 12 is an explanatory view showing an emitting region of the organic electroluminescence device.
Figure 13:
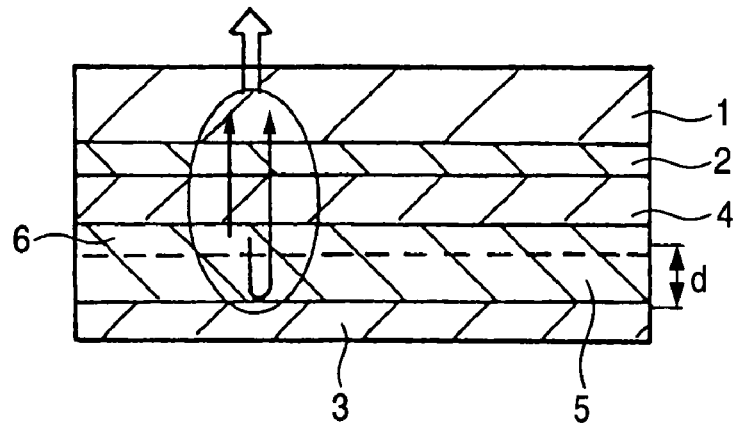
FIG. 13 is a view for explaining luminance of the organic electroluminescence device.

In the organic EL cell after the formation of the anisotropic scattering color conversion layer, white light was generated. FIG. 10 shows emission spectra before and after the formation of the light-scattering color conversion layer. In FIG. 10, the curve e shows the emission spectrum before the formation of the light-scattering color conversion layer, and the curve f shows the emission spectrum after the formation of the light-scattering color conversion layer or the light-scattering color conversion layer.

COMPARATIVE EXAMPLE 2

An organic EL cell as a basic configuration and an organic EL cell obtained by forming a light-scattering color conversion layer or an anisotropic scattering color conversion layer on the basic configuration were produced in the same manner as in Example 1 or 2 except that Alq represented by the formula (6) was formed as an electron transport layer to have a thickness of 140 nm.

A voltage of 18.2 V was applied to the organic EL cell before and after the formation of the light-scattering color conversion layer or the anisotropic scattering color conversion layer so that current conduction with a current density of 10.5 mA/cm² occurred in the cell to make the cell generate light. In this condition, the cell was evaluated by the same method as used in Example 1.

In the organic EL cell before the formation of the anisotropic scattering color conversion layer, the color of generated light and the color of guided light were different but approximately blue. The intensity of the guided light component was weak compared with Example 1. The distribution of luminance in the θ direction was as follows: 1.00 at 0 degrees, 0.95 at 10 degrees, 0.86 at 20 degrees, 0.77 at 30 degrees, 0.71 at 40 degrees, 0.63 at 50 degrees, 0.56 at 60 degrees, 0.52 at 70 degrees, and 0.45 at 80 degrees.

It was obvious from these results that the distribution of luminance in the θ direction before the formation of the anisotropic scattering color conversion layer did not satisfy the expression (1) of the invention. The total thickness of the Alq layer and the TAZ layer was 155 nm and did not satisfy the expression (2) of the invention, either.

In the organic EL cell after the formation of the light-scattering color conversion layer or the anisotropic scattering color conversion layer, white light was generated.

Then, in each of the organic EL cells obtained in Example 1 and Comparative Examples 1 and 2, the actual value of luminance at the angle of the θ direction after the formation of the light-scattering color conversion layer and the total light intensity were measured.

Results of the measurement were as shown in Table 1.

TABLE 1

| | Luminance (cd/m²) | | |
| Angle | Example 1 | Comparative Example 1 | Comparative Example 2 |
| --- | --- | --- | --- |
| 0° | 103 | 71 | 77 |
| 10° | 103 | 71 | 77 |
| 20° | 103 | 70 | 77 |
| 30° | 103 | 70 | 76 |
| 40° | 99 | 67 | 73 |
| 50° | 96 | 64 | 70 |
| 60° | 88 | 61 | 66 |
| 70° | 81 | 58 | 63 |
| 80° | 66 | 49 | 54 |
| Total Light Intensity (lm/m²) | 290 | 198 | 216 |

As is obvious from the results, the organic EL cell produced in Example 1 according to the invention is excellent in luminous efficiency per unit current because both luminance and total light intensity are higher than those of the organic EL cell produced in each of Comparative Examples 1 and 2 in the condition that current conduction with the same current density (10.5 mA/cm$^2$) occurs in each cell.

Before the formation of the light-scattering color conversion layer, the organic EL cell produced in Example 1 shows a tendency different from that of the organic EL cell produced in each of Comparative Examples 1 and 2, that is, shows a tendency that luminance becomes higher as the angle from the frontal direction becomes wider. After the formation of the light-scattering color conversion layer, the organic EL cell produced in Example 1, however, shows the same tendency as that of the organic EL cell produced in each of Comparative Examples 1 and 2, that is, shows a tendency that luminance becomes lower as the angle from the frontal direction becomes wider.

Before the formation of the light-scattering color conversion layer, the intensity of light generated from the organic EL cell produced in each of Comparative Examples 1 and 2 is higher than that generated from the organic EL cell produced in Example 1. After the formation of the light-scattering color conversion layer, results concerning the intensity of light are however reversed, that is, the intensity of light generated from the organic EL cell produced in Example 1 is higher than that generated from the organic EL cell produced in each of Comparative Examples 1 and 2.

These results are based on the fact that amplified guided light is made incident on the light-scattering color conversion layer without the influence of total reflection and used effectively as a light source for exciting the fluorescent dye because the light-scattering color conversion layer is formed without interposition of any air layer in addition to the basic configuration that normal luminance is lowered but guided light components originally confined in the inside of the cell so as to be unable to be extracted interfere with each other constructively.

EXAMPLE 3

A transparent fluorescent film (simple color conversion layer) having no light-scattering characteristic was produced in the same manner as in Example 1 except that the diffusing particles were not used when the light-scattering color conversion layer was formed. An organic EL cell was produced in the same manner as in Example 1 except that the fluorescent film was bonded onto the glass substrate of the organic EL cell through a transparent pressure-sensitive adhesive agent, and that a corner cube lens sheet having a large number of triangular pyramids arranged was bonded as the reflection/refraction angle disturbance region onto the fluorescent film through a transparent pressure-sensitive adhesive agent.

COMPARATIVE EXAMPLE 3

An organic EL cell was produced in the same manner as in Example 3 except that Alq represented by the formula (6) was formed as an electron transport layer 45 nm thick.

In each of the organic EL cells produced in Example 2 and Comparative Example 3, the angular distribution of luminance and the total intensity of light were measured in the condition that current conduction with a current density of 10.5 mA/cm$^2$ occurs in each cell. As a result, the total intensity of light generated from the organic EL cell produced in Example 3 was 243 (lm/m$^2$) whereas the total intensity of light generated from the organic EL cell produced in Comparative Example 3 was 159 (lm/m$^2$). It was confirmed that luminous efficiency was improved by the cell configuration according to the invention.

COMPARATIVE EXAMPLE 4

An organic EL cell was produced in the same manner as in Example 2 except that a general light-scattering color conversion layer having no anisotropic scattering characteristic was produced by the following method so as to be used in place of the anisotropic scattering color conversion layer formed in Example 2, and that the general light-scattering color conversion layer was bonded onto the glass substrate of the organic EL cell produced as a basic configuration in Example 2.

<Production of General Light-Scattering Color Conversion Layer>

In dichloromethane, 0.2% by weight of "Lumogen F Yellow-083" as a green fluorescent dye made by BASF Corp. was dissolved. On the other hand, 0.15% by weight of "Lumogen F Red-305" as a red fluorescent dye made by BASF Corp. was dissolved in dichloromethane. These solutions of the same quantity of 10 g were mixed with each other to prepare a mixture solution. Into the mixture solution, 6.5 g of methyl polymethacrylate as a matrix resin and 1.3 g of alumina fine particles as diffusing particles ("UA-5035" made by Showa Denko K. K., mean particle size: 0.9 µm) were added and stirred sufficiently.

The resulting solution was cast by an applicator and dried sufficiently to obtain a 55 µm-thick light-scattering color conversion layer in the form of a film.

In the condition that the same cell current (10.5 mA/cm$^2$) conducted in each of the organic EL cells produced in Example 2 and Comparative Examples 1, 2, 4, normal luminance was measured.

After a polarizing plate ("NPF-SEG1425DU" made by Nitto Denko Corp.) was placed on each cell on the assumption that the cell was used as a backlight unit for a liquid crystal display device, normal luminance was further measured.

Incidentally, in each of the organic EL cells produced in Example 2 and Comparative Examples 1 and 2 so that each organic EL cell contained the anisotropic scattering color conversion layer, the polarizing plate was placed so that the transmission axis of the polarizing plate was parallel with the stretching axis of the anisotropic scattering color conversion layer. On the other hand, in the organic EL cell produced in Comparative Example 4 so that the organic EL cell contained the general light-scattering color conversion layer having no anisotropic scattering characteristic, the polarizing plate was placed in any suitable direction.

Results of the measurement were as shown in Table 2.

TABLE 2

| | Normal luminance (cd/m$^2$) | |
|---|---|---|
| | Without Polarizing Plate | With Polarizing Plate |
| Example 2 | 98 | 66 |
| Comparative Example 1 | 63 | 41 |
| Comparative Example 2 | 66 | 43 |
| Comparative Example 4 | 103 | 47 |

As was obvious from the results, when the organic EL cell produced in Example 2 was compared with the organic EL cells produced in Comparative Examples 1 and 2, Example 1 exhibited lower luminance before the formation of the anisotropic scattering color conversion layer but Example 1 exhibited higher luminance after the formation of the anisotropic scattering color conversion layer, that is, Example 2 was excellent in luminous efficiency per unit current after the formation of the anisotropic scattering color conversion layer. This was based on the following fact. That is, the organic EL cell in Example 2 was configured in such a manner that normal luminance was reduced but guided light components which were originally confined in the inside of the cell so as to be unable to be extracted interfered with each other constructively, and the anisotropic scattering color conversion layer was formed without interposition of any air layer so that intensified guided light was made incident on the anisotropic scattering color conversion layer without the influence of total reflection with the result that the guided light was used effectively as a light source for exciting the fluorescent dye.

Before the polarizing plate was placed, the organic EL cell in Comparative Example 4 exhibited luminance equal to or higher than that of the organic EL cell in Example 2. After the polarizing plate was placed, the organic EL cell in Comparative Example 4 however exhibited greatly reduced luminance because a half or more of light was absorbed to the polarizing plate.

On the contrary, in the organic EL cell produced in Example 2, light emerging from the anisotropic scattering color conversion layer could be extracted as polarized light rich in linearly polarized light, so that absorption of light to the polarizing plate could be suppressed. Accordingly, it was obvious that an organic EL cell more excellent in luminous efficiency could be provided when Example 2 was applied to a liquid crystal display device or the like.

As described above, in the organic EL cell according to the invention, any suitable emission color such as white can be obtained easily when the amount of the luminescent material added is adjusted in the same manner as in a method using a suitable luminescent material for converting the color of an excitation light source in the case where an element for generating light with a short wavelength such as blue light or ultraviolet light is used as the excitation light source to be applied to a white LED. Moreover, luminous efficiency before the formation of the color conversion layer is low but an idea is provided so that the guided light component originally confined in the inside of the cell can be amplified. Accordingly, when the color conversion layer is formed without interposition of any air layer, the intensified guided light component much in the quantity of light in terms of solid angles can be made incident on the color conversion layer as it is. As a result, the guided light component serves effectively as a light source for exciting the luminescent material dispersed in the color conversion layer.

Moreover, because the region for disturbing an angle of reflection/refraction of light or the anisotropic scattering resin layer is formed in such a manner that micro domains different in birefringence characteristic are dispersed in the color conversion layer per se or on the light-extracting surface side of the color conversion layer, light generated by excitation can be prevented from being totally reflected by the air layer surface and confined as guided light in the inside of the cell. In addition, the light can be extracted as polarized light rich in linearly polarized light. Accordingly, when the organic EL cell is used in a liquid crystal display device or the like, a polarizing-type planar light source very excellent in efficiency can be provided. In addition, the direction of polarization of the planar light source can be selected at option.

For this reason, in the organic EL cell according to the invention, the life of the cell can be improved greatly because the operating voltage or cell current can be reduced as well as power consumption of the display device can be reduced greatly. Moreover, because EL light is used as an excitation light source so that light is generated indirectly by the luminescent material and scattered to be extracted to the outside, the organic EL cell is effective in substantially eliminating the influence of dark spots caused by the deterioration of the cell which is an issue on the organic EL cell.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. An organic electroluminescence device comprising at least one organic layer and a pair of electrodes, said organic layer including an emitting layer being sandwiched between said pair of electrodes, said pair of electrodes being provided as a reflective electrode and a transparent electrode respectively, said organic electroluminescence device being formed to satisfy the expression (1): $B_0 < B_\theta$ in which $B_0$ is a normal luminance intensity of luminescence radiated from a light extraction surface to an observer side, and $B_\theta$ is a luminance intensity of said luminescence at an angle of 50° to 70°, wherein a region for disturbing an angle of reflection/refraction of light is provided in an optical path in which the luminescence is output from said emitting layer to the observer side through said transparent electrode; at least one kind of luminescent material is contained in said region or between said region and said emitting layer so that said luminescent material generates fluorescence or phosphorescence when said luminescent material absorbs the luminescence radiated from said emitting layer as an excitation light source.

2. An organic electroluminescence device according to claim 1, wherein said organic electroluminescence device satisfies the expression (2): $(0.3/n)\lambda < d < (0.5/n)\lambda$ in which d (nm) is a distance between a center portion of a hole-electron recombination emitting region and said reflective electrode, λ (nm) is a peak wavelength of a fluorescence spectrum of a material used in said emitting layer, and n is a refractive index of said organic layer between said emitting layer and said refractive electrode.

3. An organic electroluminescence device according to claim 1, wherein said region for disturbing the reflection/refraction angle of the light is made of a light-diffusing site containing a transparent material, and a transparent or opaque material different in refractive index from the transparent material and dispersed/distributed into the transparent material.

4. An organic electroluminescence device according to claim 1, wherein said region for disturbing the reflection/refraction angle of the light is formed of a lens structure.

5. An organic electroluminescence device according to claim 1, wherein said region for disturbing the reflection/refraction angle of the light is formed of a uneven surface.

6. A planar light source including an organic electroluminescence device defined in claim 1.

7. A display device including an organic electroluminescence device defined in claim 1.

8. An organic electroluminescence device according to claim 1, wherein said region for disturbing the angle of reflection/refraction of light comprises an anisotropic scattering resin layer containing a light-transmissive resin, and micro domains dispersed/distributed in said light-transmissive resin and different in birefringence characteristic, said anisotropic scattering resin layer is formed substantially without interposition of any air layer in an optical path in which said luminescence is output from said emitting layer to the observer side through said transparent electrode.

9. An organic electroluminescence device according to claim 8, wherein said organic electroluminescence device satisfies the expression (2): $(0.3/n)\lambda < d < (0.5/n)\lambda$ in which d (nm) is a distance between a center portion of a hole-electron recombination emitting region and said reflective electrode, $\lambda$ (nm) is a peak wavelength of a fluorescence spectrum of a material used in said emitting layer, and n is a refractive index of said organic layer between said emitting layer and said refractive electrode.

10. An organic electroluminescence device according to claim 8, wherein said micro domains in said anisotropic scattering resin layer are made of one member selected from the group consisting of a liquid crystal material, a vitreous material having a liquid crystal phase fixed by supercooling, and a material having a liquid crystal phase of polymerizable liquid crystal fixed by crosslinking due to an energy beam.

11. An organic electroluminescence device according to claim 8, wherein said micro domains dispersed in said light-transmissive resin of said anisotropic scattering resin layer are made of a liquid crystal polymer having a glass transition temperature of not lower than 50° C. to exhibit a nematic liquid crystal phase at a temperature lower than the glass transition temperature of said light-transmissive resin.

12. An organic electroluminescence device according to claim 8, wherein: said anisotropic scattering resin layer exhibits refractive index differences $\Delta n_1$, $\Delta n_2$ and $\Delta n_3$ between said micro domains and other portions in directions of respective optical axes of said micro domains; and the refractive index difference $\Delta n_1$ in a $\Delta n_1$ axial direction as the highest of the refractive index differences $\Delta n_1$, $\Delta n_2$ and $\Delta n_3$ is in a range of from 0.03 to 0.5 whereas each of the refractive index differences $\Delta n_2$ and $\Delta n_3$ in two $\Delta n_2$ and $\Delta n_3$ axial directions perpendicular to the $\Delta n_1$ direction is not larger than 0.03.

13. A polarizing-type planar light source including an organic electroluminescence device defined in claim 8.

14. A display device including an organic electroluminescence device defined in claim 8.

* * * * *